(12) United States Patent
Nakazawa et al.

(10) Patent No.: US 9,647,229 B2
(45) Date of Patent: May 9, 2017

(54) COLOR FILTER FOR ORGANIC ELECTROLUMINESCENCE DISPLAY DEVICE, AND ORGANIC ELECTROLUMINESCENCE DISPLAY DEVICE

(71) Applicant: DAI NIPPON PRINTING CO., LTD., Tokyo-to (JP)

(72) Inventors: Shinsuke Nakazawa, Tokyo-to (JP); Kazuyuki Hino, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 124 days.

(21) Appl. No.: 14/353,552

(22) PCT Filed: Oct. 25, 2012

(86) PCT No.: PCT/JP2012/077643
§ 371 (c)(1),
(2) Date: Apr. 23, 2014

(87) PCT Pub. No.: WO2013/062059
PCT Pub. Date: May 2, 2013

(65) Prior Publication Data
US 2014/0284590 A1    Sep. 25, 2014

(30) Foreign Application Priority Data
Oct. 26, 2011 (JP) .................................. 2011-234657

(51) Int. Cl.
G02B 5/20 (2006.01)
H01L 51/52 (2006.01)
(Continued)

(52) U.S. Cl.
CPC ................ *H01L 51/52* (2013.01); *G02B 5/20* (2013.01); *G02B 5/201* (2013.01); *G02B 5/223* (2013.01);
(Continued)

(58) Field of Classification Search
CPC ... H01L 27/322; H01L 51/52; H01L 27/3246; H01L 27/3276; G02B 5/20; G02B 5/201; G02B 5/223; H05B 33/26
(Continued)

(56) References Cited

U.S. PATENT DOCUMENTS 6,181,406 B1 * 1/2001 Morimoto ........... G02F 1/13394
349/106
2001/0043046 A1   11/2001 Fukunaga
(Continued)

FOREIGN PATENT DOCUMENTS

JP    2003-068472 A    3/2003
JP    2005-268062 A    9/2005
(Continued)

OTHER PUBLICATIONS

International Search Report mailed Feb. 5, 2013; PCT/JP2012/077643.

*Primary Examiner* — David Vu
*Assistant Examiner* — Mouloucoulaye Inoussa
(74) *Attorney, Agent, or Firm* — Ladas & Parry LLP

(57) ABSTRACT

When a large-screen organic EL display device is developed, the generation of a brightness unevenness is prevented between its screen central region and its screen outer circumferential region. Cost risk is decreased about the formation of a structure of preventing the generation of the brightness unevenness. Furthermore, an original protecting function for its organic EL elements is maintained. The color filter of the present invention comprises a transparent sub- (Continued)

strate, a colored layer that is a pixel region formed on the transparent substrate, and a non-pixel area formed around the colored layer, wherein a convex pillar is formed in at least one spot of the non-pixel area, and an auxiliary electrode layer on a top and a side of the convex pillar, and on the non-pixel area.

15 Claims, 17 Drawing Sheets

(51) Int. Cl.
    *H01L 27/32*     (2006.01)
    *H05B 33/26*     (2006.01)
    *G02B 5/22*     (2006.01)

(52) U.S. Cl.
    CPC ........ *H01L 27/322* (2013.01); *H01L 27/3246* (2013.01); *H01L 27/3276* (2013.01); *H05B 33/26* (2013.01); *G02B 2207/113* (2013.01)

(58) Field of Classification Search
    USPC ............. 257/40; 359/885; 313/504; 349/156
    See application file for complete search history.

(56) References Cited

U.S. PATENT DOCUMENTS

| | | | |
|---|---|---|---|
| 2003/0025868 A1* | 2/2003 | Hiroshima | G02F 1/13394 |
| | | | 349/156 |
| 2003/0048072 A1 | 3/2003 | Ishihara et al. | |
| 2004/0114081 A1* | 6/2004 | Sawasaki | G02F 1/13392 |
| | | | 349/123 |
| 2005/0212413 A1* | 9/2005 | Matsuura | H01L 27/322 |
| | | | 313/504 |
| 2006/0158095 A1 | 7/2006 | Imamura | |
| 2007/0075625 A1 | 4/2007 | Yuki | |
| 2008/0157661 A1 | 7/2008 | Kajikawa et al. | |
| 2010/0097295 A1 | 4/2010 | Kwak | |

FOREIGN PATENT DOCUMENTS

| | | |
|---|---|---|
| JP | 2006-201421 A | 8/2006 |
| JP | 2007-103164 A | 4/2007 |
| JP | 2008-089633 A | 4/2008 |
| JP | 2008-166181 A | 7/2008 |
| JP | 2009-026828 A | 2/2009 |
| JP | 2009-283201 A | 12/2009 |
| JP | 2010-097925 A | 4/2010 |
| JP | 2011-096682 A | 5/2011 |

* cited by examiner

FIG. 6A
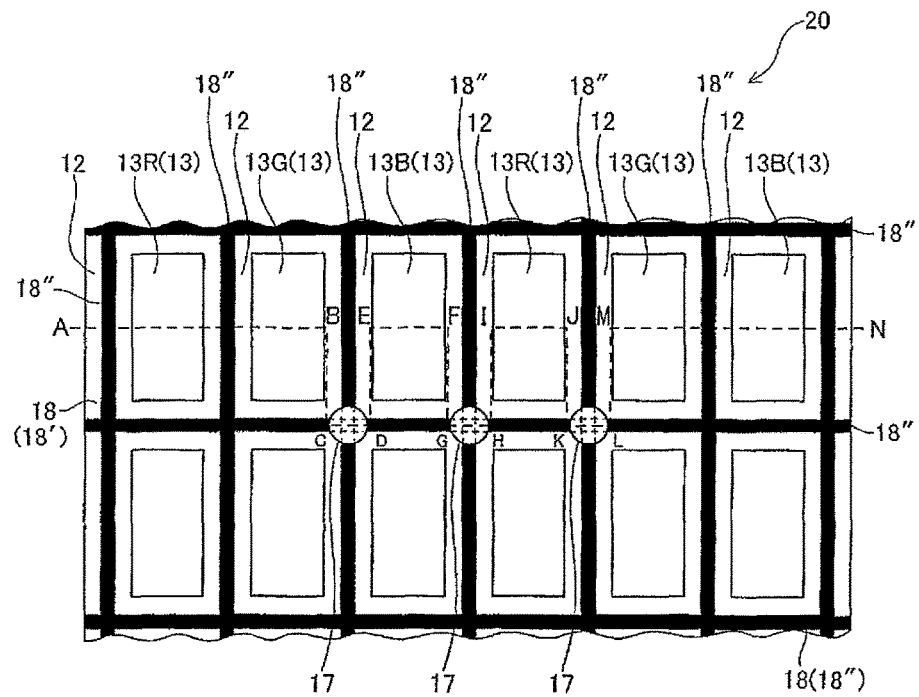
FIG. 6B
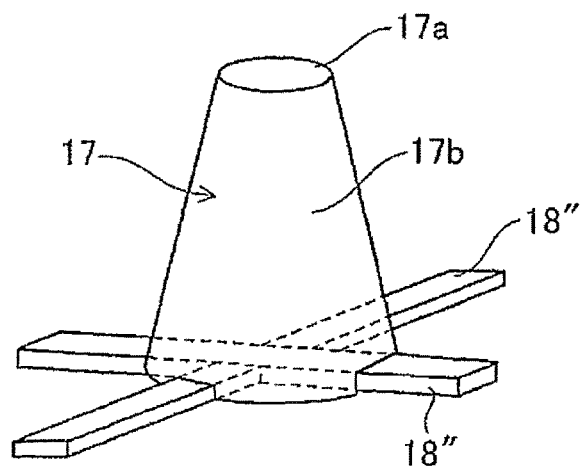
FIG. 6

FIG. 9A
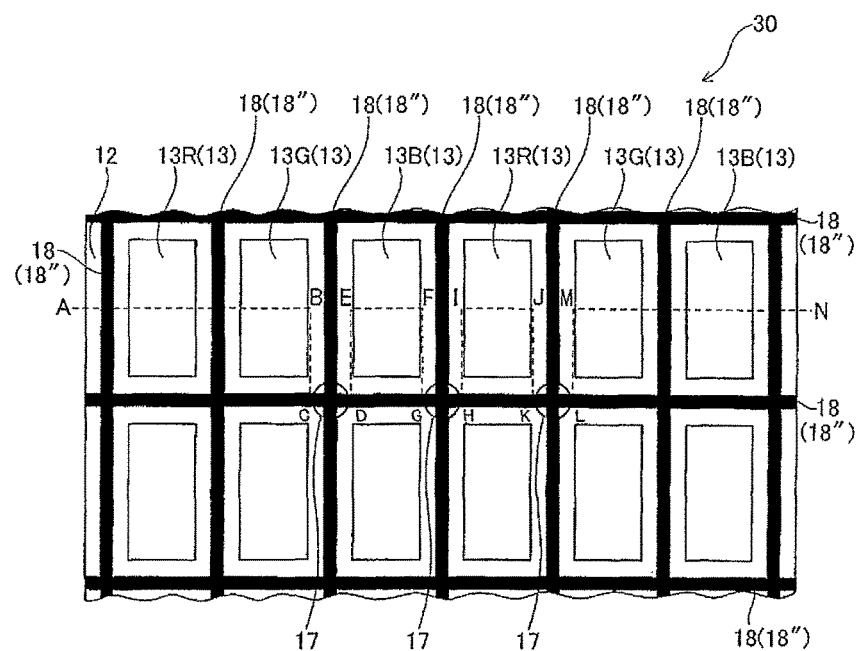
FIG. 9B
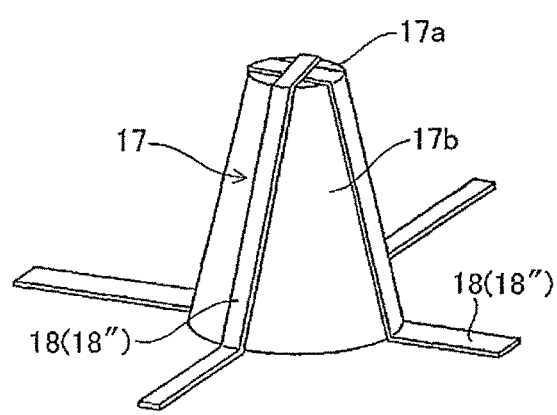
FIG. 9

FIG. 12

| Sp | Sp | Sp |
|---|---|---|
| Sp | Sc(D1) | Sp |
| Sp | Sp | Sp |

FIG. 16A
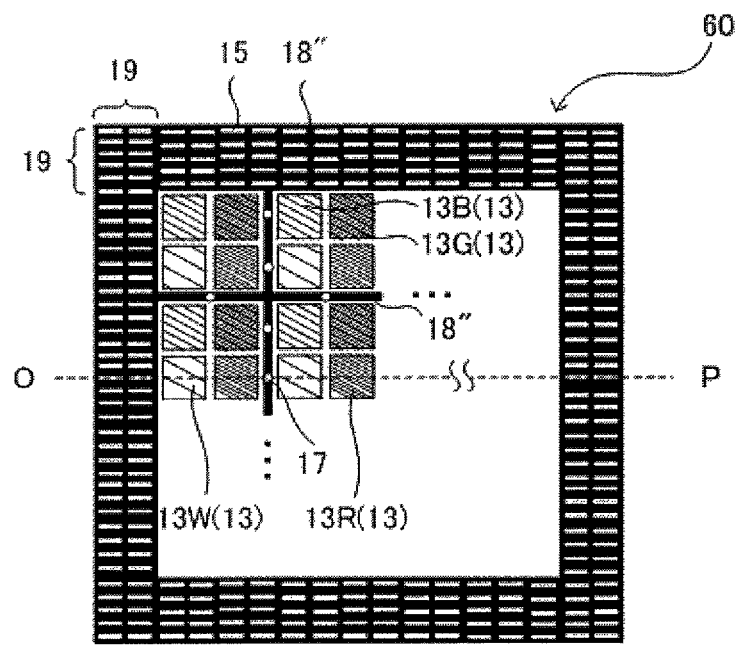
FIG. 16B
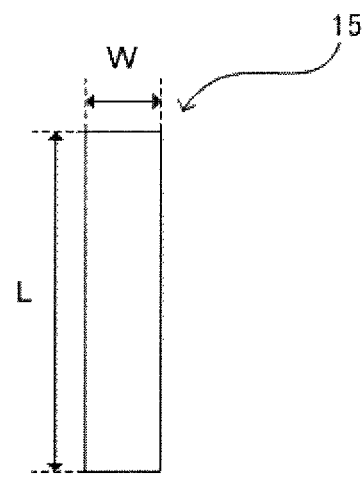
FIG. 16

FIG. 17A
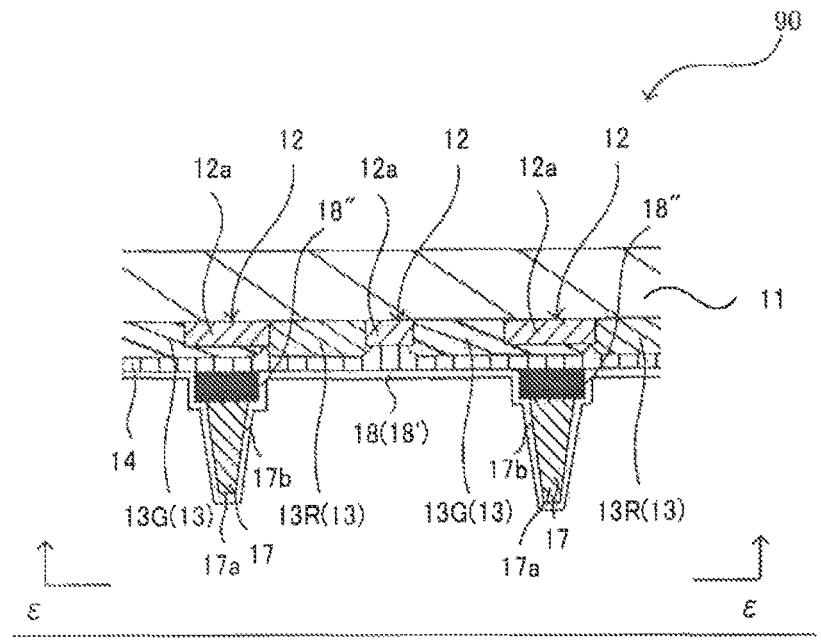
FIG. 17B
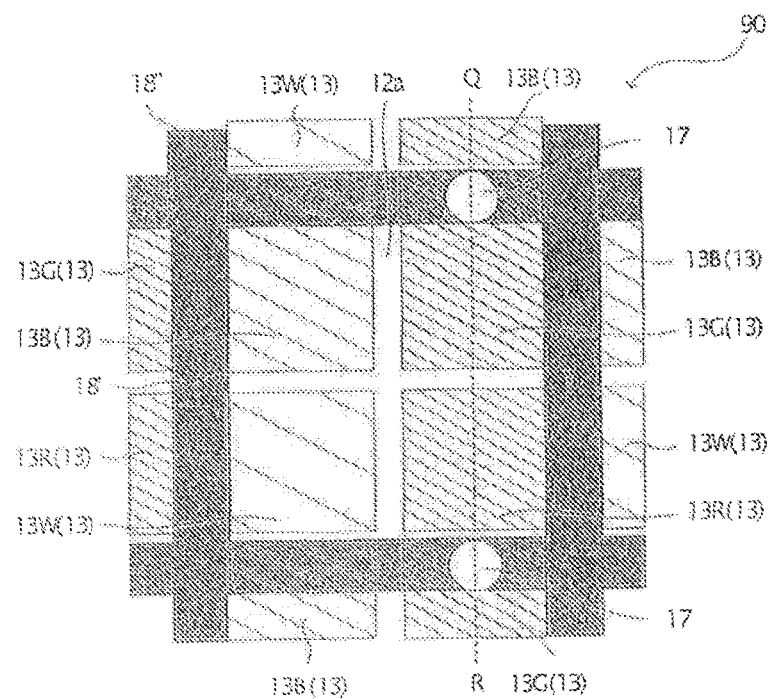
FIG. 17

COLOR FILTER FOR ORGANIC ELECTROLUMINESCENCE DISPLAY DEVICE, AND ORGANIC ELECTROLUMINESCENCE DISPLAY DEVICE

TECHNICAL FIELD

The present invention relates to a color filter used in an organic electroluminescence (also referred to as "organic EL" hereinafter) display device, and an organic EL display device formed to have this filter.

BACKGROUND ART

In recent years, flat-panel displays have been used in many fields and places, and the importance thereof has been increasingly becoming higher while informatization has been advancing.

It is said that the current major presence of flat-panel displays is liquid crystal displays (LCDs). Active developments have been made also about flat-panel displays based on a display principle different from that of liquid crystal displays (LCDs), such as organic ELs, inorganic ELs, plasma display panels (PDPs), light emitting diode display devices (LEDs), vacuum fluorescent display devices (VFDs), and field emission displays (FEDs).

These new flat-panel displays are each called a self-luminous type display. The displays are largely different from liquid crystal displays (LCDs) in points described below, and have excellent features that no liquid crystal displays (LCDs) have.

Liquid crystal displays (LCDs) are each called a light-receiving type display. Their liquid crystal itself does not emit light, and operates as the so-called shutter, which transmits and blocks external light, to constitute a display device. Accordingly, a light source is required, and a backlight is generally required. By contrast, about the self-luminous type display, a device thereof itself emits light so that no additional light source is required. Moreover, in the light-receiving type display, such as a liquid crystal display (LCD), a backlight is constantly lighted in spite of the manner of information displayed thereon, so that the display constantly consumes an electric power not different from that consumed in a full-display state. By contrast, in the self-luminous type display, only its part required to be lighted on correspondingly to information to be displayed consumes electric power; thus, the display in principle has an advantage of being smaller in power consumption than any light-receiving type display device.

Similarly, liquid crystal displays (LCDs) block light from their backlight source to gain a dark state; thus, even when the light is small in quantity, it is difficult that a leakage of the light is completely prevented. By contrast, in the self-luminous type display, the state that the display emits no light is exactly a dark state, so that the display can easily gain an ideal dark state. Thus, the self-luminous type display is overwhelmingly advantageous over the light-receiving type in contrast also. Furthermore, liquid crystal displays (LCDs) make use of polarization control based on the birefringence of liquid crystal, so as to be large in the so-called viewing angle dependency, which is a property that the display state of the displays is largely varied in accordance with the observation direction thereof. However, in the self-luminous type display, this problem is hardly caused. Additionally, liquid crystal displays (LCDs) make use of an alignment change originating from the dielectric property anisotropy of liquid crystal, which is an organic elastic material; thus, the response time thereof to an electrical signal is 1 ms or more in principle. By contrast, the above-mentioned self-luminous type techniques, the development of which has been advanced, make use of, for example, the so-called carrier transition, such as electron/hole transition, electron discharge, or plasma discharge; thus, the response time thereof is in the order of ns. In short, the response thereof is overwhelmingly speedier than that of liquid crystal techniques, so that the self-luminous type techniques do not have a problem of residual moving-images, which originate from response lags of liquid crystal displays (LCDs).

Recently, among these display devices, particularly, organic EL display devices have been actively researched. For example, the following have been suggested: (1) a display device in which light emitting layers in the three original colors are formed into predetermined patterns which are arranged in accordance with the respective emitted light colors; (2) a display device in which a light emitting layer which can emit white light is used to emit the light through a color filter in the three original colors, so that displays are attained; (3) a display device in which a light emitting layer which can emit blue light and a color conversion layer using a fluorescent dye is laid, whereby the blue light is converted to green fluorescent light or red fluorescent light so that displays in the three original colors are attained.

Organic EL display devices have been made into practical use mainly for small screens having a size of several inches in, for example, vehicle-mounted navigation systems, portable telephones or digital cameras. Recently, for flat-panel articles, typical examples thereof being flat-panel televisions, their screens have been required to be made as large as, for example, 20 inches or more in size.

However, when an organic EL display device is formed to have a large screen having a size of, for example, 20 inches or more, wirings through which driving current is supplied to its individual pixels are extremely different in length between the outer circumferential region and the central region of the screen. Thus, in the screen central region, the degree of a voltage fall is larger than that in the screen outer circumferential region to cause an inconvenience that an unevenness in the brightness of the screen is generated. This tendency becomes more remarkable as the screen is intended to be made larger. In particular, to the wirings through which driving voltage is supplied, electric current is sent through a transparent electrode made of, e.g., ITO that is formed on the organic EL layer containing a light emitting layer. This material, ITO, is larger in electrical resistance than, for example, metallic Cu, so that a voltage fall based on ITO produces a large effect.

Incidentally, the driving manner of organic EL display devices is classified into the passive matrix manner and the active matrix manner. According to the former, the EL display devices are simple in structure, but there is caused a problem that display devices which are large and give highly minute images are not easily realized. In order to make the EL display device large, the latter manner, the active matrix manner, has been actively developed. According to the active matrix manner, electric currents flowing organic EL elements arranged in respective pixels are controlled by TFTs (thin film transistors) fitted to the organic EL elements, respectively, inside a driving circuit.

Incidentally, examples of prior art appear to be related to the present invention include the following Patent Literatures 1 to 4:

CITATION LIST

Patent Literatures

Patent Literature 1: Japanese Patent No. 4489472
Patent Literature 2: Japanese Patent No. 4367346
Patent Literature 3: Japanese Patent Application Publication (JP-A) No. 2009-026828
Patent Literature 4: JP-A No. 2011-096682

In order that even when an organic electroluminescence display device is made large, a luminous brightness unevenness may not be caused which is based on a voltage fall caused by its upper transparent electrode, Patent Literature 1 discloses an organic electroluminescence display device in which a first substrate and a second substrate are arranged oppositely to each other to connect an upper electrode positioned on an element-separating bank formed on the first substrate electrically to a conductive light shielding pattern formed on the second substrate, so that at least the upper electrode and the conductive light shielding pattern are connected to feeding points.

However, according to Patent Literature 1, the element-separating bank, which is a pillar projection, is formed on the first substrate side (of the display device), on which TFTs and an organic EL layer are formed. Since the TFTs and the organic EL layer are formed on the first substrate side, this side has a complicated structure. It is said that the process of forming the element-separating bank on this side produces a considerably higher probability that the yield is made lower than a process of forming the same on the opposite side, i.e., the second substrate side. The fall in the yield of such first substrate sides results in a matter that a many-step-involved process of forming the TFTs or the organic EL layer, which is formed through complicated steps, becomes useless. Thus, it is said about costs that a very large damage is caused. Each of the organic EL elements, which has an organic EL layer sandwiched between a pair of elements, is usually covered with a sealing layer for protecting the organic EL element, so as to be protected. Thus, also in consideration of the presence of the sealing layer, it is necessary to consider technically how the organic EL element is electrically connected to the electrodes covered therewith.

Patent Literature 2 suggests a high-power-quality electrooptic device, such as an organic EL device, that is capable of making its power-source-wirings and second electrode lower in electrical resistance, decreases display-brightness unevenness, and heighten display-brightness and display-contrast. However, in this suggestion also, the same problems as described about Patent Literature 1 are caused.

Patent Literature 3 suggests an organic EL display device of an upper-side light-emitting type that has been developed to heighten the in-plane evenness of the potential of its opposed electrodes. However, in this suggestion also, the same problems as described about Patent Literature 1 are caused.

Patent Literature 4 suggests a light emitting device capable of lowering the effective resistance value of its transparent electrode and further applying an even voltage to its organic EL layer so that display defects, such as display unevenness, can be prevented. However, in this suggestion also, the same problems as described about Patent Literature 1 are caused.

SUMMARY OF INVENTION

Technical Problem

Under such an actual situation, the present invention has been made, and an object thereof is to provide a color filter, for organic electroluminescence display device, that is capable of preventing, when a large-screen organic EL display device is developed, the generation of a brightness unevenness between its screen central region and its screen outer circumferential region, of forming a structure of preventing the generation of the brightness unevenness at decreased cost risk, and further of maintaining an original protecting function thereof for the organic EL element; and an organic electroluminescence display device.

Solution to Problem

In order to solve such problems, the present invention is a color filter for organic electroluminescence display device, which is used in an organic electroluminescence display device using, as a light emitting source, light from an organic EL layer of an organic electroluminescence element, wherein the color filter comprises a transparent substrate, a colored layer that is a pixel region formed on the transparent substrate, a non-pixel area formed around the colored layer, a convex pillar formed in at least one spot of the non-pixel area, and an auxiliary electrode layer formed on a top and a side of the convex pillar, and on the non-pixel area.

In a preferred embodiment of the color filter of the invention for organic electroluminescence display device, the auxiliary electrode layer has a metal auxiliary electrode layer and a transparent electrode layer, the metal auxiliary electrode layer is arranged into a linear pattern in the non-pixel area, the convex pillar is formed on the non-pixel area in which the metal auxiliary electrode layer is linearly arranged, and the transparent electrode layer is formed to cover the top and the side of the convex pillar, and the non-pixel area, and contact the metal auxiliary electrode layer.

In a preferred embodiment of the color filter of the invention for organic electroluminescence display device, the transparent electrode layer is formed to cover the entire surface of the metal auxiliary electrode layer.

In a preferred embodiment of the color filter of the invention for organic electroluminescence display device, a light shielding part is formed in an outside-display-region light shielding region formed around its display region, the metal auxiliary electrode layer is formed on the light shielding part, the transparent electrode layer is formed to cover the metal auxiliary electrode layer formed in the outside-display-region light shielding region, and the metal auxiliary electrode layer formed in the outside-display-region light shielding region has plural openings.

In a preferred embodiment of the color filter of the invention for organic electroluminescence display device, a light shielding part is formed in the non-pixel area on the transparent substrate, an overcoat layer is formed to cover the light shielding part and the colored layer, the metal auxiliary electrode layer is formed on the overcoat layer, at least one singly-colored layer of the colored layer is laid on the light shielding part in the non-pixel area between the colored layers, and the convex pillar is formed on the metal auxiliary electrode layer which is on the light shielding part where the colored layer is laid.

In a preferred embodiment of the color filter of the invention for organic electroluminescence display device, the auxiliary electrode layer has a transparent electrode layer, and the transparent electrode layer is formed to cover the top and the side of the convex pillar and the non-pixel area.

In a preferred embodiment of the color filter of the invention for organic electroluminescence display device, the auxiliary electrode layer has a metal auxiliary electrode layer, the metal auxiliary electrode layer is linearly arranged in the non-pixel area, and is further arranged continuously and linearly on the side and the top of the convex pillar formed in the non-pixel area.

In a preferred embodiment of the color filter of the invention for organic electroluminescence display device, the auxiliary electrode layer is formed as an electroconductive light shielding part formed in the non-pixel area.

In a preferred embodiment of the color filter of the invention for organic electroluminescence display device, the non-pixel area has a cross part at which a line in a lengthwise direction crosses a line in a lateral direction, and the convex pillar is present at the cross part.

In a preferred embodiment of the color filter of the invention for organic electroluminescence display device, the convex pillar is formed in a tapered shape having a diameter that decreases gradually from a base side toward the top of the convex pillar.

In a preferred embodiment of the color filter of the invention for organic electroluminescence display device, the color filter of the invention has one or plural convex pillars, and, $D1 \geq D2$, in particular, $D1 > D2$ is satisfied in a comparison between D1 and D2, in which D1 representing the arrangement density of the convex pillar(s) arranged in a central region of the substrate, and D2 representing the arrangement density of the convex pillar(s) arranged in the other outer circumferential region of the transparent substrate.

The invention is also an organic electroluminescence display device, comprising the above-mentioned color filter, and an organic-EL-element-side substrate having a substrate, and an organic electroluminescence element containing an organic EL layer formed on the substrate, wherein: the color filter for organic electroluminescence display device and the organic-EL-element-side substrate are arranged to oppose the colored layer and the organic electroluminescence element to each other; the organic electroluminescence element comprises the organic EL layer, a lower-side electrode layer and an upper-side transparent electrode layer that are paired and arranged to sandwich the organic EL layer therebetween, and a sealing layer formed on the upper-side transparent electrode layer to cover the organic electroluminescence element; and the sealing layer has a concave into which a tip portion of the convex pillar formed in the color filter for organic electroluminescence display device can be fitted so that a portion of the auxiliary electrode layer that is formed on the top of the convex pillar contacts the upper-side transparent electrode layer to attain electrical conduction therebetween.

In a preferred embodiment of the organic electroluminescence display device of the invention, a part of the sealing layer where the concave is made is a gap portion between adjacent organic EL layers.

In a preferred embodiment of the organic electroluminescence display device of the invention, the depth of the concaves is such a depth that the concave reaches to the upper-side transparent electrode layer.

In a preferred embodiment of the organic electroluminescence display device of the invention, an electroconductive film is formed on a side of the concave.

In a preferred embodiment of the organic electroluminescence display device of the invention, a TFT for controlling an electric current flowing the organic electroluminescence element is formed for each organic electroluminescence element on the substrate of the organic-EL-element-side substrate.

In a preferred embodiment of the organic electroluminescence display device of the invention, the light emitting layer included in the organic EL layer is a white light emitting layer.

Advantageous Effects of Invention

The color filter of the present invention is configured to have a transparent substrate, a colored layer that is a pixel region formed on the transparent substrate, a non-pixel area formed around the colored layer, in which a convex pillar is formed in at least one spot of the non-pixel area, and an auxiliary electrode layer is present on a top and a side of the convex pillar, and on the non-pixel area. Thus, when the color filter is used to constitute an organic EL display device having a large screen, the generation of brightness unevenness can be prevented between the central region of the screen and the outer circumferential region thereof. Furthermore, the organic EL display device has, on the color filter side thereof, the convex pillar with the auxiliary electrode layer; thus, a structure of preventing the generation of the brightness unevenness can be formed with the tendency of decreasing cost risk. Additionally, when the color filter is integrated with an organic-EL-element-side substrate to constitute an organic EL display device, the auxiliary electrode layer formed on the convex pillar can be joined with an electrode of an organic EL element while the organic EL element ensures that this element has a sealing layer having a sufficient protecting function.

BRIEF DESCRIPTION OF DRAWINGS

FIG. 6A is a plan view that partially demonstrates the color filter for organic EL display device which is the second embodiment, and corresponds to a plan view obtained by viewing the color filter along arrows β-β in FIG. 4. FIG. 6B is a schematic perspective view showing an arrangement relationship between its convex pillars and its auxiliary electrode layer.

FIG. 9A is a plan view that partially demonstrates the color filter for organic EL display device which is the third embodiment, and corresponds to a plan view obtained by viewing the color filter along arrows γ-γ in FIG. 7. FIG. 9B is a schematic perspective view showing an arrangement relationship between its convex pillars and its auxiliary electrode layer.

FIG. 12 is a chart referred to for describing respective definitions of the arrangement density D1 of convex pillars arranged in a central region of a substrate, and the arrangement density D2 of convex pillars arranged in the other outer circumferential region thereof.

FIG. 16A is a plan view that partially demonstrates the color filter for organic EL display device which is the sixth embodiment, and corresponds to a plan view obtained by viewing the color filter along arrows δ-δ in FIG. 15. FIG. 16B is a schematic view demonstrating an opening.

FIG. 17A is a sectional view that partially illustrates a color filter of the invention for organic EL display device which is a seventh embodiment. FIG. 17B is a plan view that partially demonstrates the color filter for organic EL display device, which is the seventh embodiment, and corresponds to a plan view obtained by viewing this color filter along arrows ∈-∈ in FIG. 17A.

DESCRIPTION OF EMBODIMENTS

Figure 1:
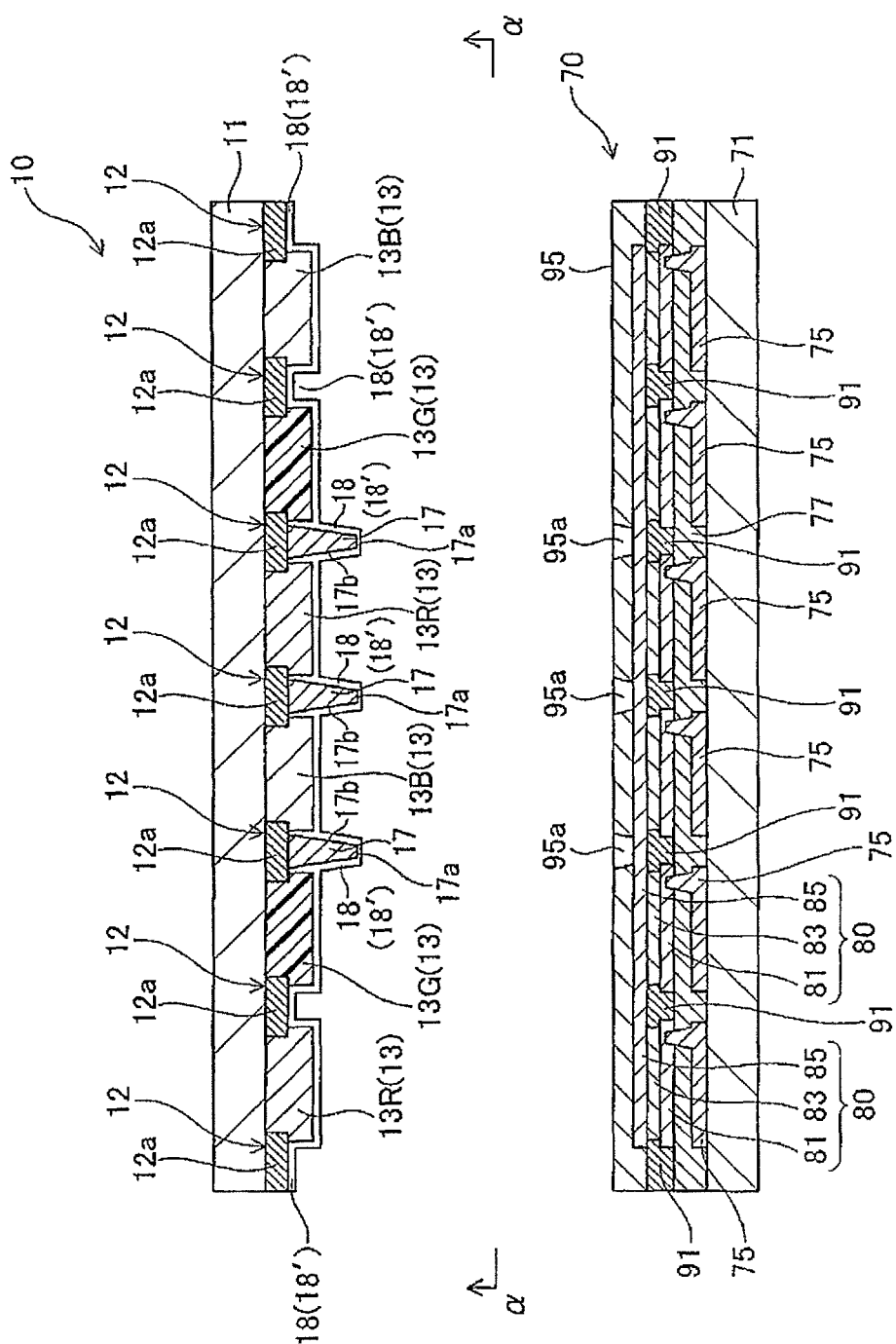
FIG. 1 is a sectional view illustrating a first embodiment of the color filter of the present invention for organic EL display device, and an organic-EL-element-side substrate therefor, and is a sectional view illustrating a cut surface of the color filter illustrated in FIG. 3 for organic electroluminescence display device along line A-B-C-D-E-F-G-H-I-J-K-L-M-N in this plan view, and a cut surface, which is similar thereto, of the organic-EL-element-side substrate.

Hereinafter, referring to the drawings, a detailed description will be made about embodiments for carrying out the present invention. Incidentally, the invention is not limited to the embodiments, which will be described below, and can be carried out in the state that the embodiments are variously modified as far as the modified embodiments do not depart from the scope of the technical conception thereof. In any one of the attached drawings, a vertical scale or a horizontal scale thereof may be exaggerated for the description, so that the ratio of the illustration between length and breadth may be different from that of an actual article of the drawing.

First Embodiment

Figure 2:
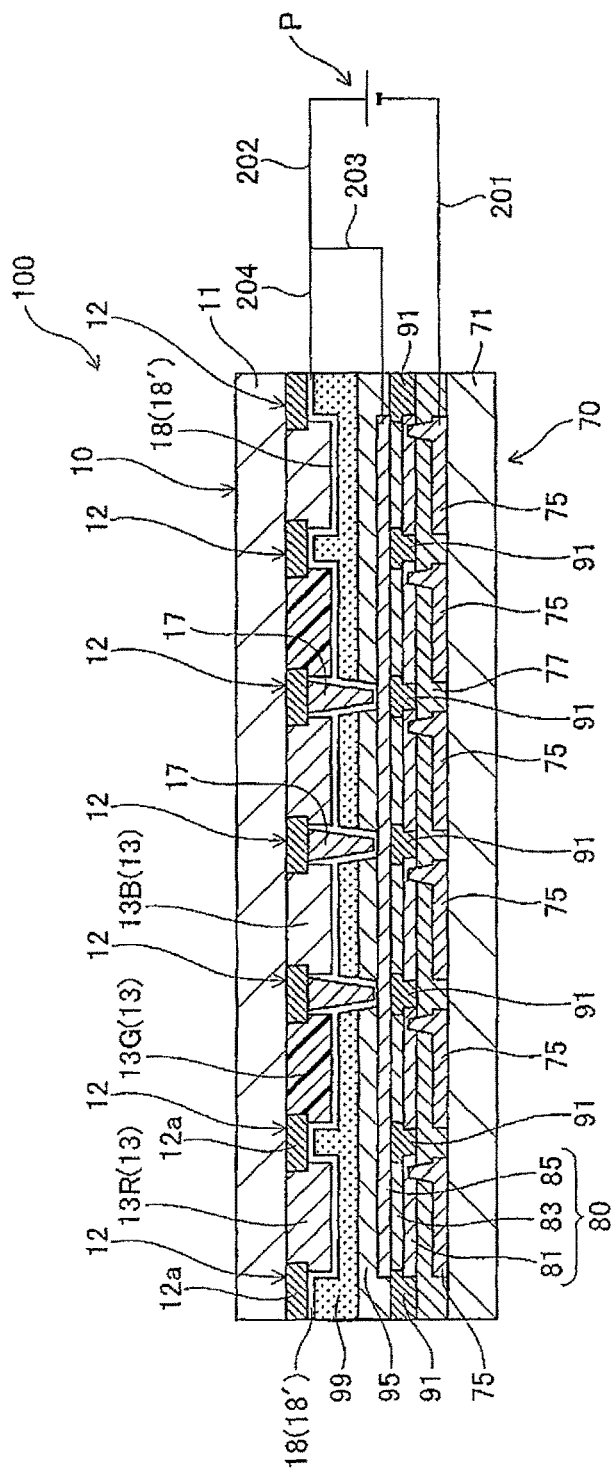
FIG. 2 is a sectional view of an organic EL display device formed by joining the color filter for organic electroluminescence display device and the organic-EL-element-side substrate which are illustrated in FIG. 1 with each other.
Figure 3:
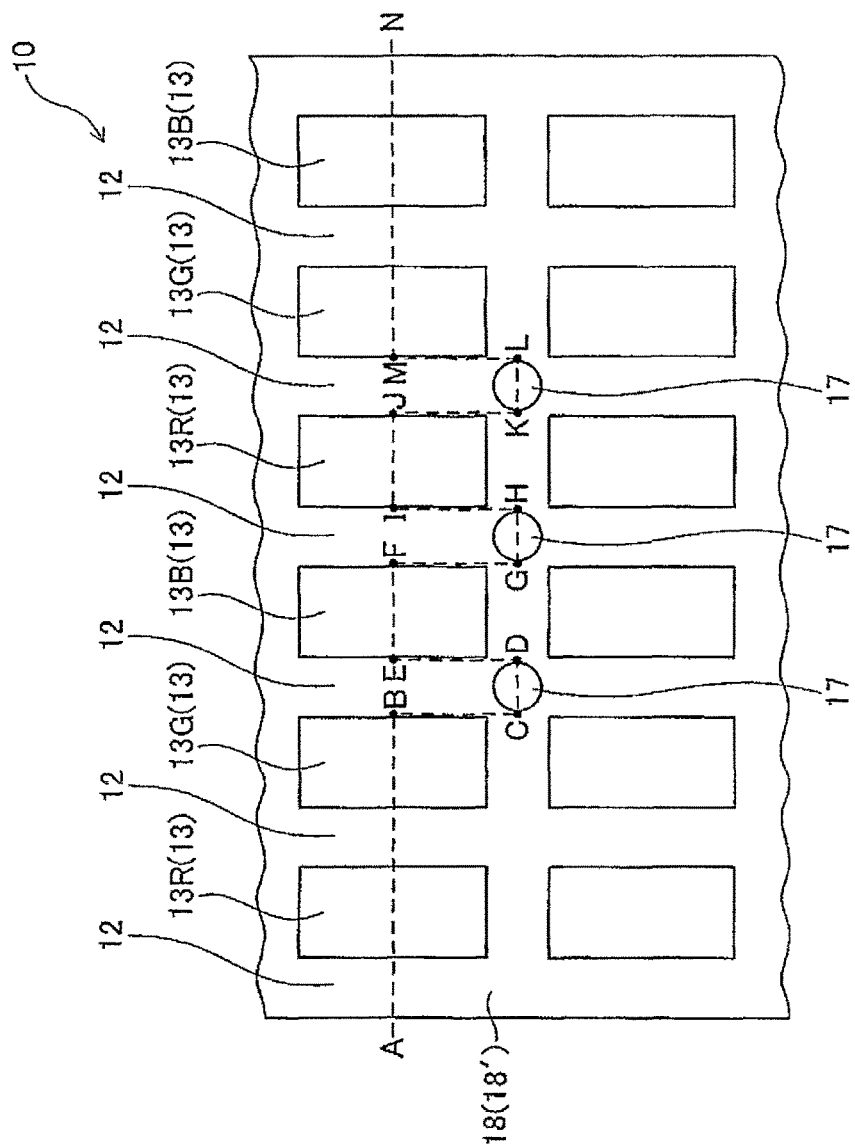
FIG. 3 is a plan view that partially demonstrates the color filter for organic electroluminescence display device which is the first embodiment, and corresponds to a plan view obtained by viewing the color filter along arrows α-α in FIG. 1

Referring to FIGS. 1 to 3, a description will be made about a color filter for organic EL display device, and an organic EL display device according to a first embodiment of the present invention.

FIG. 1 is a sectional view illustrating the color filter of the invention for organic EL display device, which is a filter 10, and an organic-EL-element-side substrate 70. This sectional view, which is a sectional view of structural members of the filter and the substrate, is a sectional view illustrating a cut surface of the color filter 10 illustrated in FIG. 3 for organic electroluminescence display device along line A-B-C-D-E-F-G-H-I-J-K-L-M-N in this plan view, and a cut surface, which is similar thereto, of the organic-EL-element-side substrate 70. FIG. 2 is a sectional view of the organic EL display device, which is a display device 100, formed by joining the color filter 10 for organic EL display device and the organic-EL-element-side substrate 70, which are illustrated in FIG. 1, with each other. FIG. 3 is a plan view that partially demonstrates the color filter 10 for organic EL display device, which is the first embodiment, and is a plan view obtained by viewing the color filter along arrows α-α in FIG. 1.

(Description of Color Filter 10 for Organic Electroluminescence Display Device)

The color filter 10 for organic electroluminescence display device of the present invention is a color filter for organic electroluminescence display device (also referred to merely as a color filter hereinafter) that is used in an organic EL display device using, as a light emitting source, light from an organic EL layer containing a light emitting layer of an organic EL element.

As illustrated in FIG. 1, the color filter 10 of the present invention comprises a transparent substrate 11, colored layer 13 that is/are pixel regions formed on this transparent substrate 11, and a non-pixel area 12 formed around the colored layers 13. When attention is paid to most of the colored layers 13 that are other than ones arranged in the outermost circumference of the substrate, the non-pixel area 12 is usually present in any gap between the adjacent colored layers 13.

The transparent substrate 11 is not particularly limited as far as the substrate 11 is a substrate transparent to visible rays. The transparent substrate 11 may be a substrate equivalent to any transparent substrate used in an ordinary color filter. Specific examples thereof include rigid materials such as a quartz glass piece, a Pyrex (registered trade name) glass piece, and a synthetic quartz piece; and transparent flexible materials such as a transparent resin film and an optical resin plate.

The colored layer 13 has a red colored layer 13R, a green colored layer 13G, and a blue colored layer 13B. These layers are successively arranged to form a pattern. This pattern arrangement is not particularly limited to the illustrated pattern arrangement. The arrangement may be a known arrangement of a stripe, mosaic, triangular, or four-pixel-combination located type, or any other type. The area of each of the individual colored layers may be set at will.

Incidentally, in the figures, the number of the colored layers 13 as pixel regions (the pixel number) is merely demonstrated as an example. The number is not limited to the number of the illustrated ones. The method of forming the colored layer 13 may be a method for forming a colored layer 13 in an ordinary color filter, for example, a photolithographic method, ink-jetting method or printing method.

In the non-pixel area 12 in the present embodiment, it is usually desired that a light shielding part 12a (referred to also as the so-called black matrix) is formed. However, this part is not essential for causing the present invention to exhibit the effect and advantages thereof. The light shielding part 12a is usually formed into a lattice-form light shielding layer, and is usually made of a photoresist or printing ink that contains a black pigment, a binder resin and a solvent, or a metal such as chromium. Examples of the black pigment used in the printing ink include carbon black, and titanium black. Examples of the binder resin include a copolymer of benzyl methacrylate/styrene/acrylic acid/2-hydroxyethyl methacrylate. The solvent may be selected from various known solvents.

The method for forming the light shielding part 12a may be any one of a photolithographic method, various pattern-printing methods, various plating methods, and others.

In the color filter 10 of the present invention, a convex pillar, or convex pillars 17 are formed in one spot or more spots of the non-pixel area 12. The convex pillars 17 are formed in such a manner that electroconductivity is given to the exterior thereof as will also be described later, thereby making it possible to prevent brightness unevenness between the central region of the screen and the outer circumferential region of the screen, which is an object of the present invention. Accordingly, in order that the convex pillars 17 can produce the effect thereof, it is desired to form the convex pillars 17 in spots where brightness unevenness is easily generated, particularly, spots near the central region of the substrate. In the present embodiment, near the central region in the sectional view of FIG. 1, the convex pillars 17 the number of which is three are formed. However, these convex pillars are illustrated merely as an example. Thus, the number thereof and the location place thereof are not limited to those illustrated therein. It is advisable to set the number and the location place appropriately in such a manner that the effect and the advantages of the present invention can be optimally exhibited.

In the invention, the convex pillars 17 act to prevent a voltage fall by a matter that an electric current from the organic-EL-element-side substrate 70, which has an organic EL layer 83, is conducted through an auxiliary electrode layer 18 formed on the convex pillars 17 into the color filter 10 side (of the display device 100), so as to be released to the side, as will be detailed later.

In the invention, the convex pillars 17 are preferably made of a resin material, and are formed by, for example, a photolithographic method. Furthermore, in the invention, the color fitter is formed to have the auxiliary electrode layer 18, which has electroconductivity, on respective tops 17a and respective sides 17b of the convex pillars 17, and on the non-pixel area 12. It is desired that the convex pillars are configured to be made into such a tapered shape that the diameter is gradually decreased from the individual bases thereof toward the respective tops 17a. This is for making it easy to integrate the color filter with the organic-EL-element-side substrate 70 having the organic EL layer, which will also be described later. A specific example of the shape of the convex pillars is, for example, tapered shape. In a case where the convex pillars have the tapered shape, at the time of forming a transparent electrode layer to cover the tops and the sides of the convex pillars, a breaking or disconnection of the transparent electrode layer can be prevented. Examples of the tapered shape include a circular truncated cone, which is a shape obtained by cutting away its tip portion from a circular cone as illustrated; a triangular truncated pyramid; and a square cone platform.

The width of the bases of the convex pillars 17, which are bottom portions thereof, is set into the range of about 8 to 100 μM; the width of the tops 17a is set into that of about 3 to 95 μm; and the height thereof is set into that of about 2.5 to 25 μm. The B tapered angle inclined from the bases to the respective tops 17a is set into that of about 30 to 85°.

When the convex pillars are each in a tapered shape to have an upper bottom surface and a lower bottom surface, the ratio by area of the upper bottom surface to the lower bottom surface is not particularly limited as far as the area of the upper bottom surface of the convex pillar permits the upper bottom surface of the convex pillar to be electrically connected to the upper-side transparent electrode layer when the color filter for organic EL display device is joined to the organic-EL-element-side substrate. For example, the ratio ranges preferably from 5 to 60%, more preferably from 10 to 50%, and in particular preferably from 15 to 40%.

The first embodiment will be more specifically described. The auxiliary electrode layer 18 is configured as the so-called solid film which is a transparent electrode layer 18'. Specifically, the transparent electrode layer 18' as the auxiliary electrode layer 18 is formed, as a solid film, onto the whole of one of the two surfaces of the transparent substrate 11, the one surface having the colored layer 13, which is pixel regions formed on the transparent substrate 11, the non-pixel area 12 formed around the colored layers 13 (in which the light shielding part 12a is preferably formed), and the convex pillars 17 formed in the non-pixel area 12. In short, the entire surface in FIG. 3 is covered with the transparent electrode layer 18' as the solid film. The formation of the solid film of the transparent electrode layer 18' makes it possible that the electroconductive auxiliary electrode layer 18 is formed on the respective tops 17a and sides 17b of the convex pillars 17, and on the non-pixel area 12, as described above. In the present embodiment, the colored layer 13 is also covered with the transparent electrode layer 18'.

The forming material of the transparent electrode layer 18' may be, for example, a transparent and electroconductive metal oxide. Examples of the metal oxide include indium tin oxide (ITO), indium oxide, zinc oxide, and stannic oxide. The film thickness of the transparent electrode layer 18' is set into the range of 50 to 1500 nm, and more preferably 120 to 1200 nm.

The method for forming the transparent electrode layer may be, for example, vapor deposition or sputtering.

When the transparent electrode layer is hardened, the annealing temperature therefor is preferably relatively low. For example, the temperature ranges preferably from 150 to 250° C., more preferably from 170 to 230° C., and in particular preferably from 180 to 210° C. In a case where the annealing temperature when the transparent electrode layer is hardened is in the range, the hardening shrinkage of the transparent electrode layer can be restrained to maintain adhesiveness between the transparent electrode layer and an underlying layer of the transparent electrode layer that contacts the transparent electrode layer, such as the colored layer, the light shielding part, or an overcoat layer. Moreover, the light transmissivity of the transparent electrode layer, which will be detailed below, can be maintained.

The light transmissivity of the transparent electrode layer is not particularly limited as far as the light transmissivity is at such a degree that when the color filter of the present embodiment for organic EL display device is used for an organic EL display device, desired advantages can be obtained. For example, at wavelengths of 380 to 780 nm, the average transmittance thereof ranges preferably from 85 to 98%, more preferably from 90 to 97%, and in particular preferably from 92 to 96%.

The average transmittance is measurable by, for example, an ultraviolet-visible spectrophotometer UV3600™ manufactured by Shimadzu Corp.

An electroconductive material may be incorporated into the resin material constituting the convex pillars 17 to give electroconductivity thereto. However, there may be unfavorably caused a problem such that the convex pillars 17 are insufficient in strength or the convex pillars cannot gain a sufficient electroconductivity. Thus, the electroconductive material may be incorporated, to some extent, into the convex pillars 17; however, it is necessary to form the auxiliary electrode layer 18 on the convex pillars 17.

A further description will be made about the colored layer 13 used favorably in the color filter 10 of the present invention.

The colored layer 13, which has the red colored layer 13R, the green colored layer 13G, and the blue colored layer 13B, is laid to correspond to unit pixels of the organic EL display device 100 (see FIG. 2). The red colored layer 13R, green colored layer 13G and blue colored layer 13B are each formed onto the substrate by dispersing or dissolving a colorant, such as a pigment or dye, having one of the colors into a light sensitive resin, and subsequently applying the dispersion or solution thereto.

Examples of the colorant used in the red colored layer 13R include perylene pigments, lake pigments, azo pigments, quinacridone pigments, anthraquinone pigments, anthracene pigments, and isoindoline pigments. These pigments may be used alone or in the form of a mixture of two or more thereof.

Examples of the colorant used in the green colored layer 13G include phthalocyanine pigments such as halogen-multisubstituted phthalocyanine pigments and halogen-multisubstituted copper phthalocyanine pigments, tripheylmethane basic dyes, isoindoline pigments, and isoindolinone pigments. These pigments or dyes may be used alone or in the form of a mixture of two or more thereof.

Examples of the colorant used in the blue colored layer 13B include copper phthalocyanine pigments, anthraquinone pigments, indanthrene pigments, indophenol pigments, cyanine pigments, and dioxazine pigments. These pigments may be used alone or in the form of a mixture of two or more thereof.

Incidentally, as illustrated in FIG. 3, it is desired that the non-pixel area 12 is formed to have cross parts where lines in a lengthwise direction cross lines in a transverse direction and the convex pillars 17 are formed at the cross parts of the non-pixel area 12. This case makes it possible to cause the position where the convex pillars 17 are formed to have a spatial room, so that the convex pillars 17 can be formed in a heightened-strength state. Additionally, the case can make the formation of the convex pillars relatively easy to contribute to an improvement in the yield of filters or devices of the present invention. Dependently on the design of the TFTs concerned, the convex-column-17-formed position may not be the cross parts.

(Description of Organic-EL-Element-Side Substrate 70)

As has been illustrated in FIG. 1, the organic-EL-element-side substrate 70 has the substrate 71, and organic electroluminescence elements 80 each containing one of the organic EL layers 83 formed on the substrate 71.

By integrating/joining this organic-EL-element-side substrate 70 with the color filter 10, the organic electroluminescence display device 100 as has been illustrated in FIG. 2 is formed. Incidentally, when the organic-EL-element-side substrate 70 is integrated/joined with the color filter 10, the organic electroluminescence elements 80 of the organic-EL-element-side substrate 70, and the colored layer 13 of the color filter 10 are arranged oppositely to each other.

Each of the organic electroluminescence elements 80 has one of the organic EL layers 83, and a lower-side electrode layer 81 and an upper-side transparent electrode layer 85 that are paired and arranged in such a manner that this organic EL layer 83 is sandwiched therebetween. An insulating layer 91 is formed around the organic EL layer 83, and this insulating layer 91 divides the organic EL layer 83, and further prevents a direct contact between the lower-side electrode layer 81 and the upper-side transparent electrode layer 85. Furthermore, a sealing layer 95 mainly for protecting the organic EL layer 83 is formed on the upper-side transparent electrode layer 85 to cover the whole of the elements.

Concaves 95a are made in the front surface of the sealing layer 95 that is opposed to the color filter 10. The concaves 95a are formed in such a manner that tips of the convex pillars 17 formed in the color filter 10 can be inserted/attached into the concaves 95a, and the auxiliary electrode layer 18 portions formed on the tops 17a of the convex pillars 17 contact the upper-side transparent electrode layer 85 of the organic electroluminescence elements 80 so that electrical conduction is attained therebetween. It is desired to make the concaves 95a into a form having the same tapered shape as the tips of the convex pillars 17 to be inserted into the concaves, so that the tips of the convex pillars 17 can be fitted into the concaves 95a. The depth of the concaves 95a is rendered such a depth that the concaves reach to the upper-side transparent electrode layer 85. In order to keep electrical conduction easily between the auxiliary electrode layer 18 and the upper-side transparent electrode layer 85, an electroconductive film may be formed on respective sides of the concaves 95a, which is not illustrated.

Parts where the concaves 95a are formed are preferably parts where the organic EL layer is not present in order that the concaves 95a may not narrow the light emitting area. As has been illustrated in FIG. 1 or 2, it is advisable to form the concaves 95a, for example, in gaps between the adjacent organic EL layers 83.

When the above-mentioned structure is adopted, the convex pillars 17 can be caused to act to prevent a voltage fall by the matter that an electric current from the organic-EL-element-side substrate 70, which has the organic EL layer 83, is conducted through the auxiliary electrode layer 18 formed on the convex pillars 17 into the color filter 10 side (of the device 100), so as to be released to the side, as described above.

Incidentally, as has been illustrated in the figures, on the substrate 71, TFTs (thin film transistors) 75 for controlling respective electric currents flowing in the organic electroluminescence elements 80, which constitute pixels, are arranged and formed for the respective pixels. Usually, to a circuit of each of the TFTs are connected a gate line, a signal line and a power line which are not illustrated. The method for forming the TFTs 75 may be in accordance with a known method. An insulating layer 77 is usually formed on the TFTs 75. Incidentally, for the insulating layer 77, the same material as used for the insulating layer 91, which will be detailed below, is usable.

Hereinafter, an additional description will be made about each of the constituents of the organic-EL-element-side substrate 70.

Substrate 71:

The substrate 71 used in the present invention may be any substrate on which the organic electroluminescence elements 80 and so on can be supported. The substrate 71 may be a substrate usable ordinarily as a constituent member of an organic EL display device. The present embodiment is of the so-called top emission type, in which light is taken out from the color filter 10 side of the organic display device 100; therefor, the substrate 71 of the organic-EL-element-side substrate 70 may be transparent or opaque.

Insulating Layer 91:

As described above, the insulating layer 91 in the present invention is formed to prevent a direct contact between the lower-side electrode layer 81 and the upper-side transparent electrode layer 85.

Examples of the forming material of this insulating layer 91 include photocurable resins such as a photosensitive polyimide resin and an acrylic resin, and thermosetting resins, and inorganic materials. The pattern of the insulating layer 91 may be usually made into a linear form. By the formation of the insulating layer 91, a pattern can be formed which has openings in the form of, for example, a matrix or stripe.

The method for forming the insulating layer 91 may be a method of painting the above-mentioned material and patterning the painted material by photolithography. The method may be, for example, a printing method.

Organic EL Layer 83:

The organic EL layer 83 in the present invention is formed to have a light emitting layer, in particular preferably, a white light emitting layer. The layer 83 may be configured to have, instead of the white light emitting layer, a red light emitting layer, a blue light emitting layer, and a green light emitting layer in order. Herein, a description will be made, demonstrating a case where the organic EL layer 83 has a white light emitting layer, which is a more preferred embodiment.

The organic EL layer 83 is usually a layer composed of plural organic layers besides the light emitting layer, and may be rendered a layer having a charge injecting layer such as a hole injecting layer or an electron injecting layer, and a charge transporting layer such as a hole transporting layer for transporting holes into the white light emitting layer, or an electron transporting layer for transporting electrons into the white light emitting layer.

White Light Emitting Layer:

It is sufficient for the white light emitting layer usable as a preferred light emitting layer in the present invention that this layer is a layer that can emit white light. Specifically, it is sufficient that this white light emitting layer is a layer having an emission spectrum at least in a wavelength range of blue light rays (430 to 470 nm), green light rays (470 to 600 nm) and red light rays (600 to 700 nm) when a voltage is applied to the organic EL layer 83. In the emission spectrum, the ratio between the maximum emission intensity of a peak of the green light rays (470 to 600 nm) and the maximum emission intensity of a peak of the blue light rays (430 to 470 nm) (the ratio of the maximum emission intensity of the green light ray peak/that of the blue light ray peak) ranges preferably from 0.3 to 0.8, more preferably from 0.3 to 0.7, and in particular preferably from 0.3 to 0.5.

When the ratio of the maximum emission intensity of the green light ray peak to that of the blue light ray peak is in the range, a power consumption decreasing effect based on a matter that the transmissivity of the blue pattern is large can be more effectively exhibited. About the red light rays (600 to 700 nm), the ratio between the maximum emission intensity of a peak of the red light rays and the maximum emission intensity of the peak of the blue light rays (the ratio of the maximum emission intensity of the red light ray peak/that of the blue light ray peak) ranges preferably from 0.3 to 1.0.

The material constituting this white light emitting layer is not particularly limited as far as the material is a material which can emit fluorescence or phosphorescence. The light emitting material may have hole transporting performance or electron transporting performance. Examples of the light emitting material include colorant type materials, metal complex type materials, and polymeric type materials.

Examples of the colorant type material include cylopentamine derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perynone derivatives, perylene derivatives, oligothiophene derivatives, trifumanylamine derivatives, oxadiazole dimer, and pyrazoline dimer.

Examples of the metal complex type materials include aluminum quinolinol complexes, benzoquinolinol beryllium complexes, benzoxazole zinc complexes, benzothiazole zinc complexes, azomethyl zinc complexes, porphyrin zinc complexes, europium complexes, and metal complexes each having, as a central metal, for example, Al, Zn, Be, or a rare earth metal such as Tb, Eu or Dy and having, as a ligand, for example, an oxadiazole, thiadiazole, phenylpyridine, phenylbenzimidazole or quinoline structure.

Examples of the polymeric type materials include poly-p-phenylene vinylene derivatives, polythiophene derivatives, poly-p-phenylene derivatives, polysilane derivatives, polyacetylene derivatives, polyfluorene derivatives, polyvinyl carbazole derivatives, and compounds obtained by polymerizing the above-mentioned colorant type materials and metal complex materials, respectively.

The method for forming the white light emitting layer include vapor deposition, printing, ink-jetting, spin coating, casting, dipping, bar coating, blade coating, roll coating, gravure coating, flexographic, and spray coating methods; and self-assembling methods (an alternative adsorption process and a self-assembled monomolecular film process). Of these methods, particularly preferred are vapor deposition, spin coating and ink-jetting methods.

The film thickness of the white light emitting layer used in the present invention is usually set into the range of about 5 nm to 5

Hole Injecting Layer:

In the present invention, a hole injecting layer may be formed between the white light emitting layer and the anode (the lower-side electrode layer 81 or the upper-side transparent electrode layer 85). By laying the hole injecting layer, the injection of holes into the white light emitting layer is stabilized so that the EL display device can be heightened in emission efficiency.

The forming material of the hole injecting layer used in the invention may be a material usable generally in a hole injecting layer of any organic EL element. It is sufficient for the forming material of the hole injecting layer that this material has either hole-injecting performance or electron-blocking performance.

Specific examples of the forming material of the hole injecting layer include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polysilane based copolymers, aniline based copolymers, and electroconductive polymeric oligomers such as thiophene oligomers. Additional examples of the forming material of the hole injecting layer include porphyrin compounds, aromatic tertiary amine compounds, and styrylamine compounds.

The film thickness of the hole injecting layer made of such a material is usually set into the range of about 5 nm to 1 μm.

Electron Injecting Layer:

In the present invention, an electron injecting layer may be formed between the white light emitting layer and the cathode (the upper-side transparent electrode layer 85 or the lower-side electrode layer 81). By laying the electron injecting layer, the injection of electrons into the white light emitting layer is stabilized so that the EL display device can be heightened in emission efficiency.

Examples of the forming material of the electron injecting layer used in the invention include nitro-substituted fluorene derivatives, anthraquinodimethane derivatives, diphenylquinone derivatives, thiopyran dioxide derivatives, heterocyclic tetracarboxylic acid anhydrides such as naphthalene perylene, carbodiimide, fluorenylidenemethane derivatives, anthraquinodimethane and anthrone derivatives, oxadiazole derivatives, thioazole derivatives each obtained by substituting an oxygen atom of the oxadiazole ring of an oxadiazole derivative with a sulfur atom, quinoxaline derivatives each having a quinoxaline ring known as an electron withdrawing group, metal complexes of any 8-quinolinol derivative, such as tris(8-quinolinol)aluminum, phthalocyanine, metal phthalocyanine, and distyrylpyrazine derivatives.

The film thickness of the electron injecting layer made of such a material is usually set into the range of about 5 nm to 1 μm.

Upper-Side Transparent Electrode Layer 85:

The upper-side transparent electrode layer 85 in the present invention is laid to apply a voltage to the organic EL layer 83 sandwiched between this layer and the lower-side electrode layer 81, which will be detailed later, to cause light emission in the white light emitting layer.

The upper-side transparent electrode layer 85 is a layer for causing light generated in the white light emitting layer to be transmitted into the color filter side of the organic EL display device. Thus, as has been illustrated in FIG. 1, this layer is arranged between the organic EL layer 83 and the color filter 10, for organic EL display device, located over the organic EL layer 83.

The forming material of the upper-side transparent electrode layer 85 used in the present invention may be, for example, a transparent and electroconductive metal oxide. Examples of this metal oxide include indium tin oxide (ITO), indium oxide, zinc oxide, and stannic oxide.

The film thickness of the upper-side transparent electrode layer 85 made of such a material is usually set into the range of about 100 to 300 nm.

The method for forming the upper-side transparent electrode layer 85 is preferably, for example, a method of forming a thin film by vapor deposition, sputtering or some other method, and then patterning the film by photolithography.

Lower-Side Electrode Layer 81:

As has been illustrated in FIG. 1, the lower-side electrode layer 81 in the present invention is arranged between the organic EL layer 83 and the substrate 71 positioned below the organic EL layer 83. The lower-side electrode layer 81 is a layer that is the other of the two electrodes for causing the white light emitting layer to emit light, and is formed as an electrode having electric charges opposite to those of the upper-side transparent electrode layer 85.

The forming material of the used lower-side electrode layer 81 may be, for example, a metal, an alloy or a mixture thereof that has a small work function of about 4 eV or less. Specific examples thereof include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, and rare earth metals. More preferred are the magnesium/silver mixtures, magnesium/aluminum mixtures, magnesium/indium mixtures, aluminum/aluminum oxide ($Al_2O_3$) mixtures, and lithium/aluminum mixtures.

About the lower-side electrode layer 81, the sheet resistance thereof is preferably several Ω/centimeter, or less. The film thickness of the lower-side electrode layer 81 is usually set into the range of about 10 nm to 1 μm.

The method for forming the lower-side electrode layer 81 is preferably, for example, a method of forming a thin film by vapor deposition, sputtering or some other method, and then patterning the film by photolithography. To the lower-side electrode layer 81 are connected the TFTs (thin film transistors) 75 for controlling electric currents flowing the respective organic EL elements.

Sealing Layer 95

The sealing layer 95 having the above-mentioned concaves 95a is formed on the upper-side transparent electrode layer 85, that is, between the upper-side transparent electrode layer 85 and the color filter 10 for organic EL display device. Usually, the sealing layer 95 is laid as a protective layer for blocking the arrival of water vapor or oxygen at the organic EL layer 83.

The sealing layer 95 is not particularly limited as far as the layer can exhibit barrier performance against water vapor or oxygen, and is further transparent. Examples thereof include a transparent inorganic film, a transparent resin film and an organic-inorganic hybrid film. Of these films, a transparent inorganic film is preferred from the viewpoint of a high barrier performance thereof.

Preferable examples of the forming material of the transparent inorganic film usable preferably as the sealing layer 95 include oxides such as aluminum oxide, silicon oxide, and magnesium oxide; nitrides such as silicon nitride; and oxynitrides such as silicon oxynitride. Silicon oxynitride is particularly preferred since pinholes are not easily generated therein so that the oxynitride is high in gas barrier performance.

The sealing layer 95 may be mono-layered or multi-layered. When the sealing layer 95 is, for example, a multi-layered member in which plural silicon oxynitride films are laminated onto each other, the barrier performance can be further improved. When the sealing layer 95 is multi-layered, different materials may be used for its individual layers.

It is advisable to decide the film thickness of the sealing layer 95 appropriately in accordance with the kind of a used forming material of the sealing layer 95, and others. The thickness is usually set into the range of about 5 nm to 5 µm. If this thickness of the sealing layer 95 is too small, the barrier performance tends to become insufficient. If the thickness of the sealing layer 95 is too large, cracking and other phenomena tend to be easily caused by a film stress of the thin film.

When the sealing layer 95 is a transparent inorganic film, the method for forming this transparent inorganic film is not particularly limited as far as the method is a formation-method for a film formable in a vacuum state. Examples thereof include a sputtering method, an ion plating method, vacuum vapor deposition methods such as an electron beam (EB) vapor deposition method and a resistance heating method, an atomic layer epitaxial (ALE) method, a laser ablation method, and a chemical vapor deposition (CVD) method. Of these methods, sputtering, ion plating and CVD methods are preferred from the viewpoint of producing performance.

The method for forming the concaves 95a at predetermined sites of the sealing layer 95 is preferably, for example, a method of forming a thin film for the sealing layer 95, and then patterning the film by photolithography.

By integrating/joining the organic-EL-element-side substrate 70 having the above-mentioned structure with the color filter 10, the organic electroluminescence display device 100 as illustrated in FIG. 2 is formed. Specifically, in the integration/joint of the organic-EL-element-side substrate 70 with the color filter 10, the position of the concaves 95a made in the sealing layer 95 of the organic-EL-element-side substrate 70 is made consistent with that of the tips of the convex pillars 17 formed inside the non-pixel area of the color filter 10, and then the tips of the convex pillars 17 are fitted/attached into the concaves 95a in the sealing layer 95 to bring the auxiliary electrode layer 18 regions formed on the tops 17a of the convex pillars into contact with the upper-side transparent electrode layer 85. In this way, the two are integrated with each other to attain electrical conduction therebetween. Thereafter, as illustrated in FIG. 2, an adhesive layer 99 is filled into a gap between the sealing layer 95 and the auxiliary electrode layer 18 to attain the integration/joint of the color filter 10 with the organic-EL-element-side substrate 70. Thus, the organic electroluminescence display device 100 as illustrated in FIG. 2 is formed.

The adhesive layer 99 is not particularly limited as far as the layer is a transparent layer having adhesive force and curability. Preferred examples of a material for forming this adhesive layer 99 include a thermo-curable adhesive and a photocurable adhesive. Usually, the material is preferably a material for which no solvent is required. A film-form layer of an adhesive sheet type may be used. Specific examples thereof include epoxy-type, acrylic-type, polyimide-type, and synthetic-rubber-type adhesives and adhesive sheets.

It is allowable to: keep the gap between the sealing layer 95 and the auxiliary electrode layer 18 empty without laying the adhesive layer 99; seal respective circumferential regions of the organic-EL-element-side substrate 70 and the color filter 10 for organic electroluminescence display device in the atmosphere of an inert gas such as nitrogen; and then provide a water-catching agent such as barium oxide inside the empty space.

About the form of wiring from the power source, for example, as has been illustrated in FIG. 2, the EL display device has a wiring 201 extending from one of the electrodes of a power source P to the individual TFTs 75, wirings 202-203 extending from the other power source electrode to the upper-side transparent electrode layer 85, and wirings 202-204 extending from the other power source electrode to the auxiliary electrode layer 18. A wiring circuit for causing the organic EL elements 80 to emit light is the wiring 201 plus the wirings 202-203. A wiring circuit for releasing electric currents in the TFTs to an auxiliary electrode layer 18 on the color filter side (of the display device) to prevent a voltage fall is the wiring 201 plus the wirings 204-202.

As described above, the adoption of this structure makes it possible to cause the convex pillars 17 to act to prevent a voltage fall by the matter that an electric current from the organic-EL-element-side substrate 70, which has the organic EL layer 83, is conducted through the auxiliary electrode layer 18 formed on the convex pillars 17 into the color filter 10 side (of the device 100), so as to be released to the side.

Incidentally, this embodiment has been described by taking the following mode up as a preferred mode: a mode of using the color filter having the red colored layer 13R, the green colored layer 13G and the blue colored layer 13B to render white light emitted from the organic EL layer, which has the white light emitting layer, respective lights emitted into three colors of RGB. However, the application of the essence of the present invention is not limited to this mode. Thus, the essence is applicable to, for example, the so-called blue EL color conversion layer (CCM) full color mode of using a color conversing material layer (CCM), which absorbs blue light to emit green light and red light, to cause an organic EL layer for emitting blue light to emit respective lights in three colors of RGB, or the so-called RGB light emitting layer parallel-arrangement full color mode of dividing organic EL elements for emitting RGB lights, respectively, from each other, correspondingly to individual pixels. That such modifications are permissible is fittable also to second to fourth embodiments that will be described below.

Second Embodiment

Figure 4:
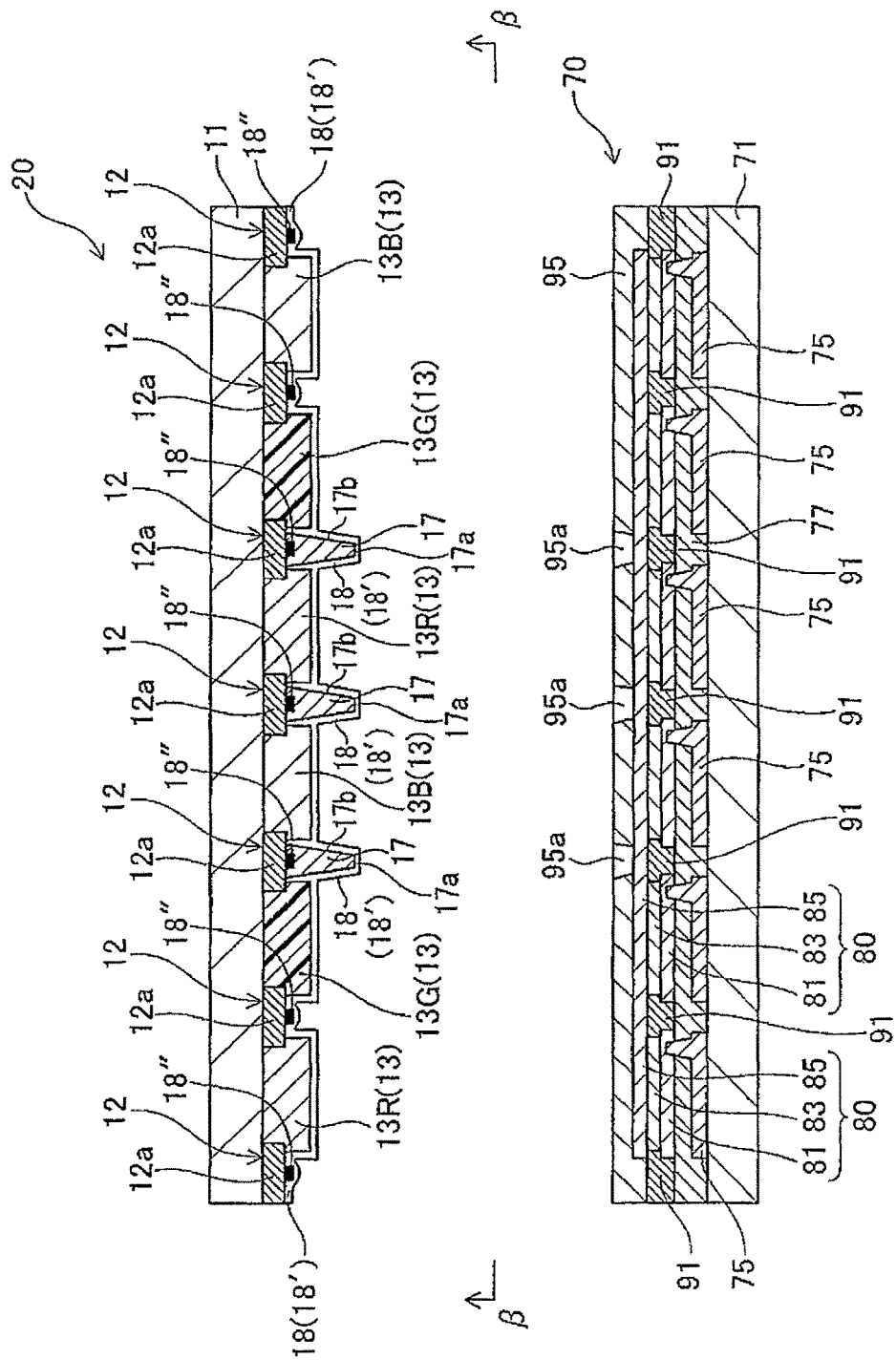
FIG. 4 is a sectional view illustrating a second embodiment of a color filter of the present invention for organic EL display device, and an organic-EL-element-side substrate therefor, and is a sectional view illustrating a cut surface of the color filter illustrated in FIG. 6A for organic electroluminescence display device along line A-B-C-D-E-F-G-H-I-J-K-L-M-N in this plan view, and a cut surface, which is similar thereto, of the organic-EL-element-side substrate.
Figure 5:
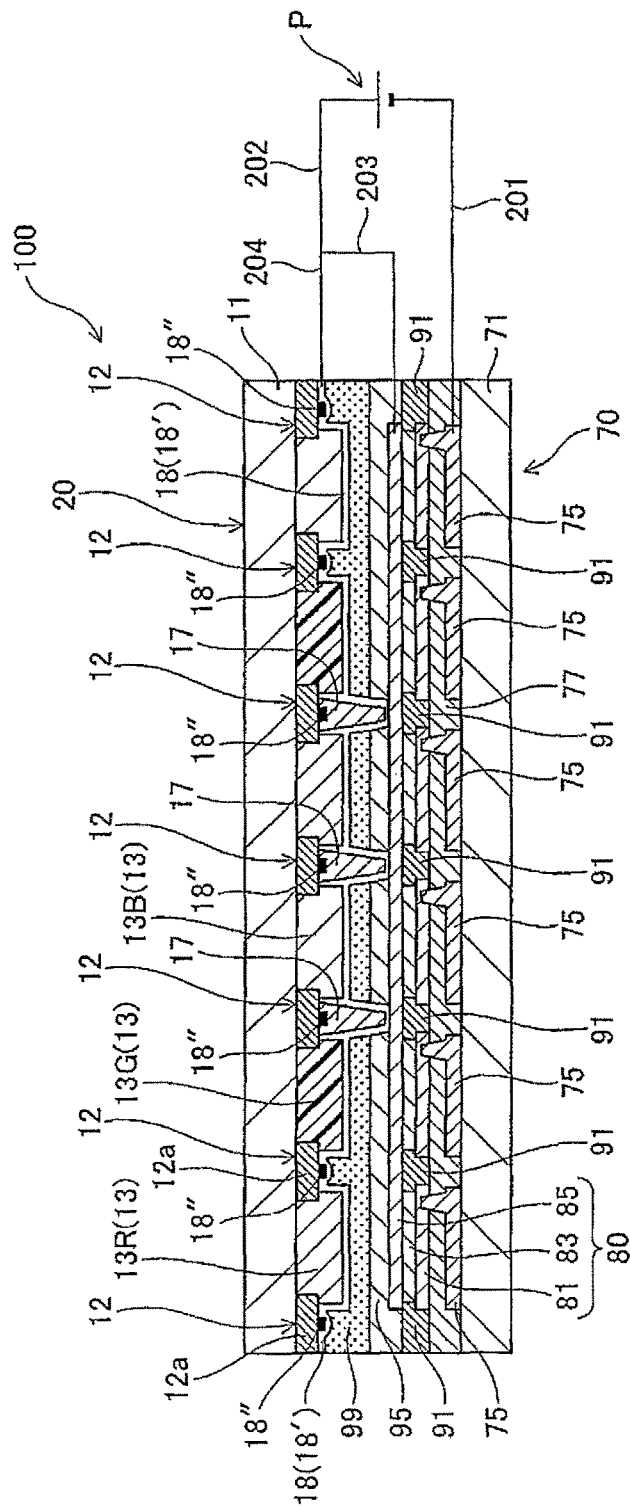
FIG. 5 is a sectional view of an organic EL display device formed by joining the color filter for organic EL display device and the organic-EL-element-side substrate which are illustrated in FIG. 4 with each other.

Referring to FIGS. 4 to 6, a description will be made about a color filter for organic EL display device, and an organic EL display device according to a second embodiment of the present invention.

FIG. 4 is a sectional view illustrating the color filter of the invention for organic EL display device, which is a filter 20, and an organic-EL-element-side substrate 70. This sectional view, which is a sectional view of structural members of the filter and the substrate, is a sectional view illustrating a cut surface of the color filter 20 illustrated in FIG. 6 for organic electroluminescence display device along line A-B-C-D-E-F-G-H-I-J-K-L-M-N in this plan view, and a cut surface, which is similar thereto, of the organic-EL-element-side substrate 70. FIG. 5 is a sectional view of the organic EL display device, which is a display device 100, formed by joining the color filter 20 for organic EL display device and the organic-EL-element-side substrate 70, which are illustrated in FIG. 4, with each other. FIG. 6A is a plan view that partially demonstrates the color filter 20 for organic EL display device, which is the second embodiment, and corresponds to a plan view obtained by viewing the color filter along arrows β-β in FIG. 4. FIG. 6B is a schematic perspective view showing an arrangement relationship between its convex pillars and its auxiliary electrode layer.

Incidentally, in the individual figures for the present invention, the same reference signs or numbers represent members substantially identical with each other.

A point in which the second embodiment illustrated in FIGS. 4 to 6 is different from the first embodiment is that a metal auxiliary electrode layer 18" as an auxiliary electrode layer 18 is laid below convex pillars 17. Specifically, the auxiliary electrode layer 18 has the metal auxiliary electrode layer 18" and a transparent electrode layer 18'; as illustrated in FIG. 6A, the metal auxiliary electrode layer 18" is arranged into a pattern of lines inside a non-pixel area 12; the convex pillars 17 are formed on the non-pixel area 12 regions where the metal auxiliary electrode layer 18" is linearly arranged (see FIG. 6B); and the transparent electrode layer 18', which is a solid film, is formed to cover respective tops 17a and sides 17b of the convex pillars 17, and the non-pixel area 12, and further contact the metal auxiliary electrode layer 18". This point is different. In short, the reader is expected to imagine, as a three-dimensional image, a state that the transparent electrode layer 18', which is a transparent solid film, covers the upper of the article in the state illustrated in FIG. 6B.

The second embodiment, that is, the further addition of the metal auxiliary electrode layer 18" makes it possible to lower the electrical resistance of the auxiliary electrode layer 18 further, and make the film thickness of the transparent electrode layer 18' small. Thus, the embodiment can produce an advantage of being improved in light transmissivity, and other advantages.

The material used in the metal auxiliary electrode layer 18" may be, for example, a metal such as Cu, Ag, Au, Pt, Al, Cr or Co, any alloy thereof, or a multi-layered metal film, a typical example thereof being MAM (molybdenum/aluminum neodymium alloy/molybdenum).

The method for forming the metal auxiliary electrode layer 18" is preferably, for example, a method of forming a thin film by vapor deposition, sputtering or some other method, and then patterning the film by photolithography.

Third Embodiment

Figure 7:
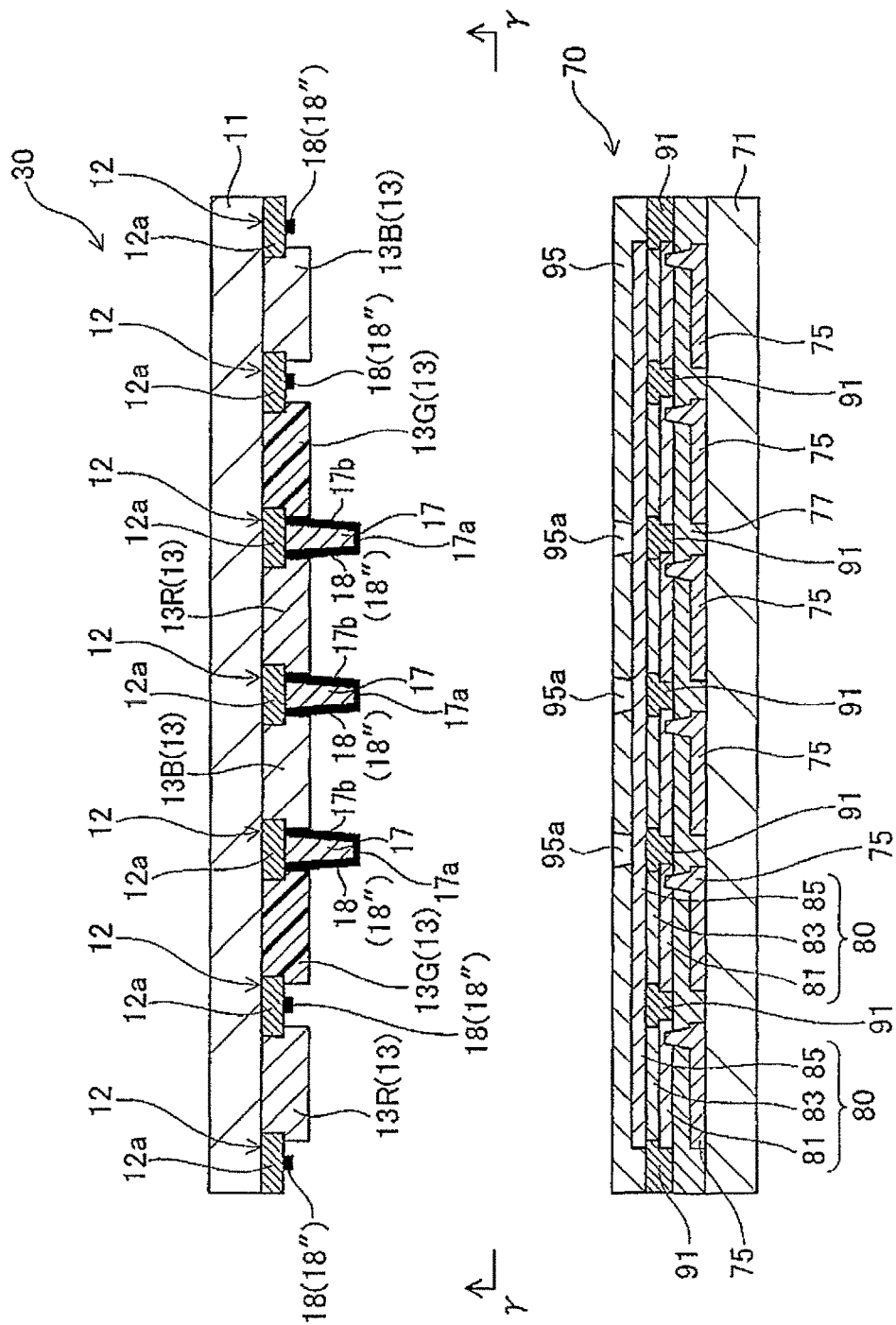
FIG. 7 is a sectional view illustrating a third embodiment of the color filter of the present invention for organic EL display device, and an organic-EL-element-side substrate therefor, and is a sectional view illustrating a cut surface of the color filter illustrated in FIG. 9A for organic electroluminescence display device along line A-B-C-D-E-F-G-H-I-J-K-L-M-N in this plan view, and a cut surface, which is similar thereto, of the organic-EL-element-side substrate.
Figure 8:
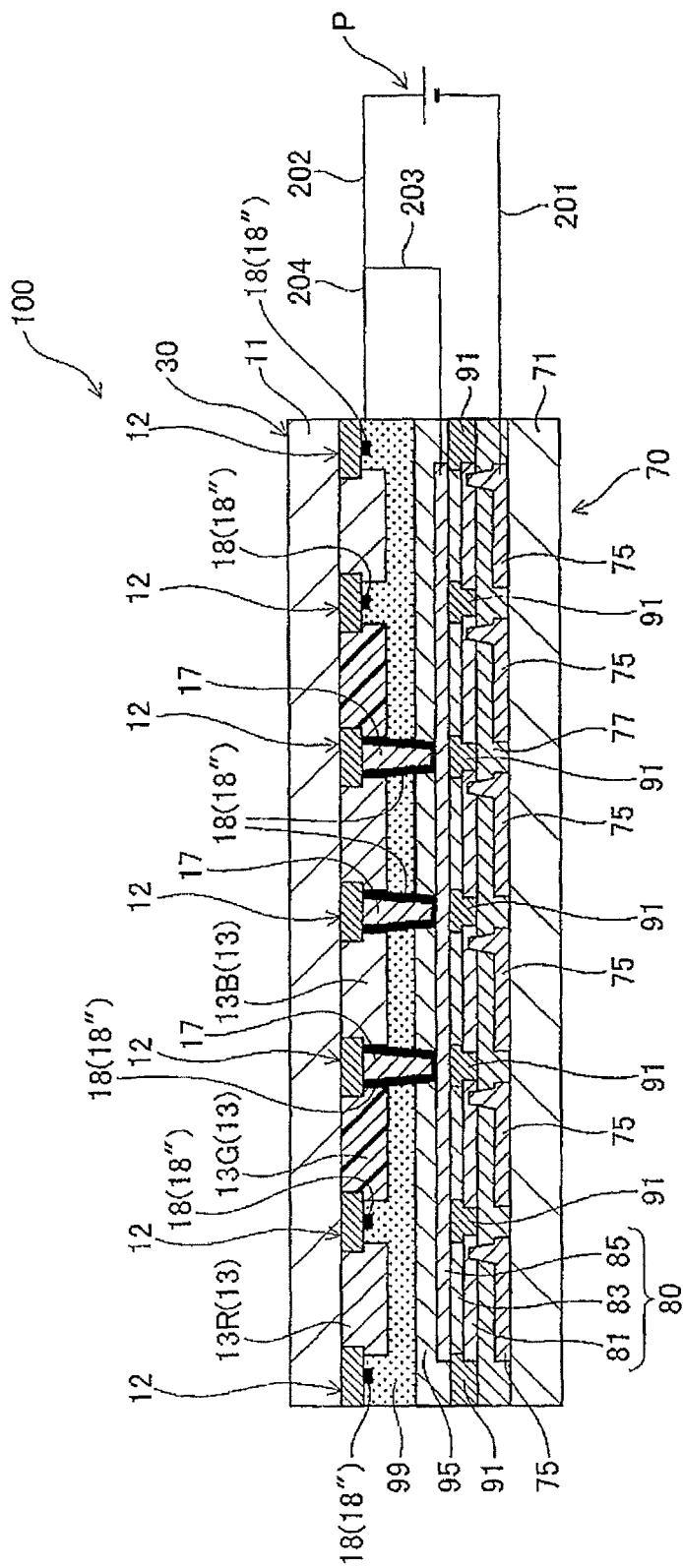
FIG. 8 is a sectional view of an organic EL display device formed by joining the color filter for organic EL display device and the organic-EL-element-side substrate which are illustrated in FIG. 7 with each other.

Referring to FIGS. 7 to 9, a description will be made about a color filter for organic EL display device, and an organic EL display device according to a third embodiment of the present invention.

FIG. 7 is a sectional view illustrating the color filter of the invention for organic EL display device, which is a filter 30, and an organic-EL-element-side substrate 70. This sectional view, which is a sectional view of structural members of the filter and the substrate, is a sectional view illustrating a cut surface of the color filter 30 illustrated in FIG. 9 for organic electroluminescence display device along line A-B-C-D-E-F-G-H-I-J-K-L-M-N in this plan view, and a cut surface, which is similar thereto, of the organic-EL-element-side substrate 70. FIG. 8 is a sectional view of the organic EL display device, which is a display device 100, formed by joining the color filter 30 for organic EL display device and the organic-EL-element-side substrate 70, which are illustrated in FIG. 7, with each other. FIG. 9A is a plan view that partially demonstrates the color filter 30 for organic EL display device, which is the third embodiment, and corresponds to a plan view obtained by viewing the color filter along arrows γ-γ in FIG. 7. FIG. 9B is a schematic perspective view showing an arrangement relationship between its convex pillars and its auxiliary electrode layer.

In the individual figures for the present invention, the same reference signs or numbers represent members substantially identical with each other.

A point in which the third embodiment illustrated in FIGS. 7 to 9 is different from the first embodiment is that only a metal auxiliary electrode layer 18" is used as an auxiliary electrode layer 18 and further this metal auxiliary electrode layer 18" is continuously formed into the form of lines on the pixel area 12 and convex pillars 17. Specifically, the auxiliary electrode layer 18 has the metal auxiliary electrode layer 18"; the metal auxiliary electrode layer 18" is linearly arranged in the non-pixel area 12 (see FIG. 9A); and further the metal auxiliary electrode layer 18" is also continuously and linearly arranged on respective sides 17b and tops 17a of the convex pillars 17 formed in the non-pixel area 12. The reader is expected to see, as a three-dimensional image, a perspective view illustrated in FIG. 9B.

It is advisable to use, as a method for forming the metal auxiliary electrode layer 18", for example, a method of using sputtering or some other method to form a metal layer onto the color filter on which the convex pillars 17 have been formed, and then cause the metal to remain into a predetermined pattern by photolithography.

According to the third embodiment, the auxiliary electrode layer 18 is made only of the metal auxiliary electrode layer 18", which is low in electrical resistance. Accordingly, the auxiliary electrode layer 18 can be further lowered in electrical resistance.

Incidentally, in the third embodiment, it is necessary to form the metal auxiliary electrode layer 18" onto the sides 17b of the convex pillars 17. Thus, it is desired to make the degree of the taper of the convex pillars 17 gentle (for example, taper angle=about 30 to 85°), considering this necessity.

Incidentally, the material of the metal auxiliary electrode layer 18" may be the same material as described in the second embodiment.

Fourth Embodiment

Figure 10:
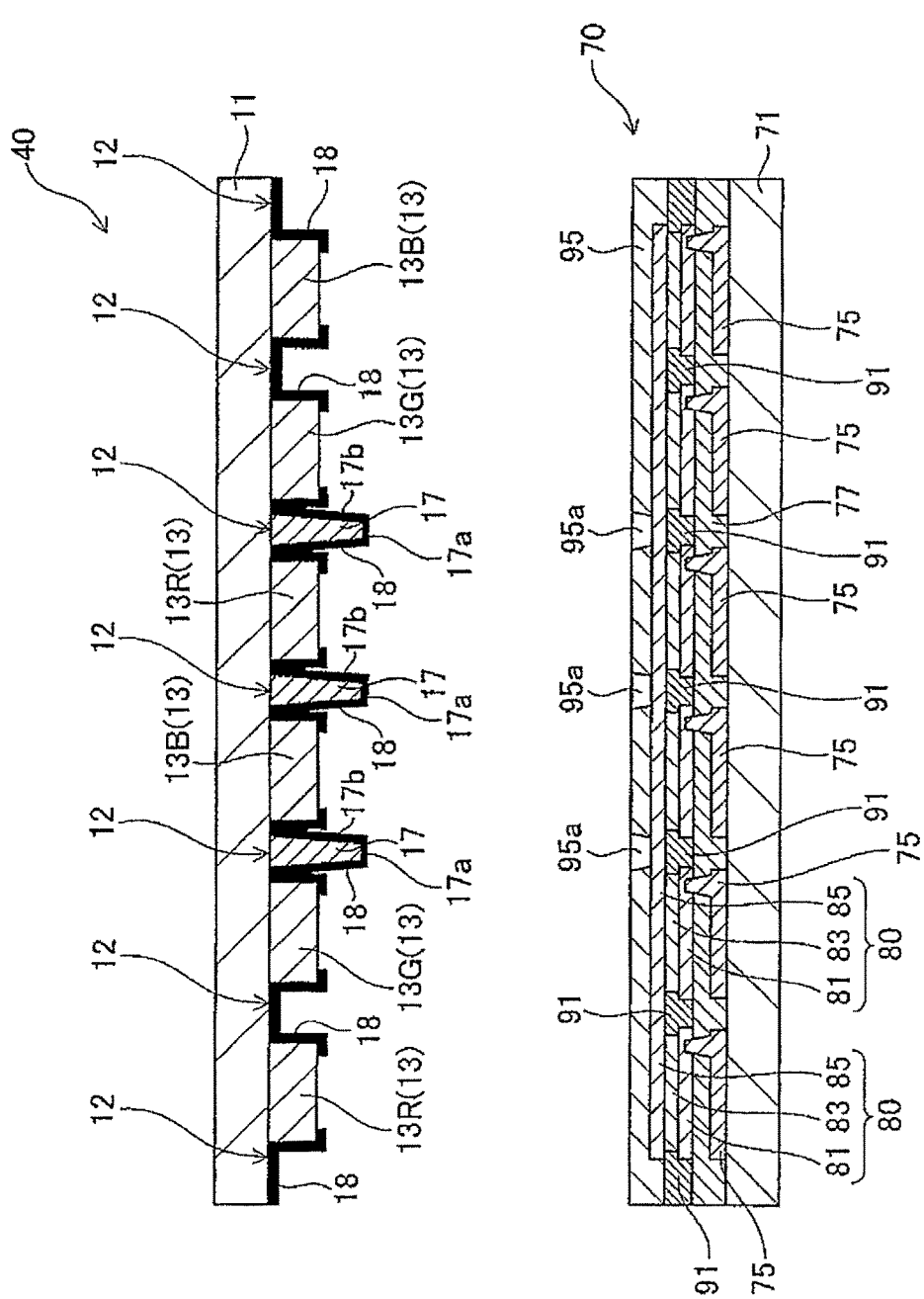
FIG. 10 is a sectional view illustrating a fourth embodiment of the color filter of the present invention for organic EL display device, and an organic-EL-element-side substrate therefor.
Figure 11:
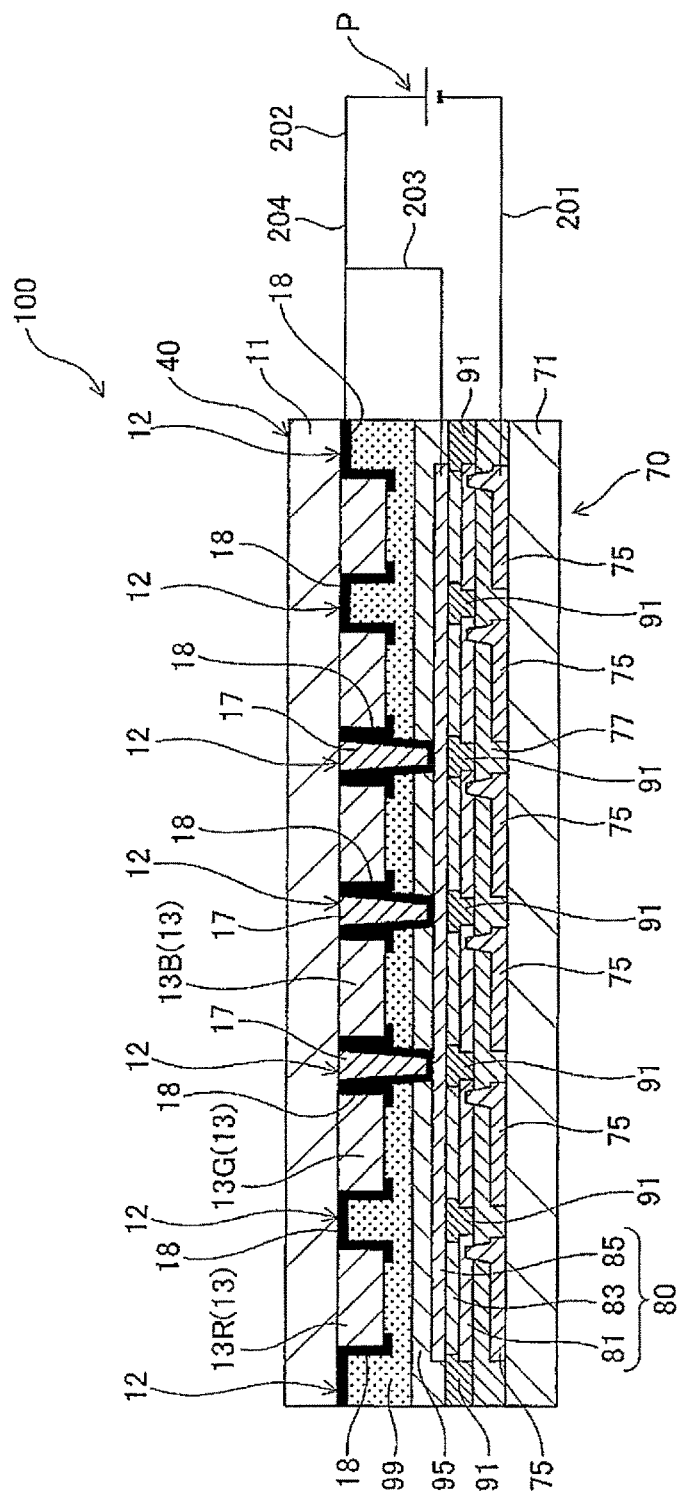
FIG. 11 is a sectional view of an organic EL display device formed by joining the color filter for organic EL display device and the organic-EL-element-side substrate which are illustrated in FIG. 10 with each other.

Referring to FIGS. 10 to 11, a description will be made about a color filter for organic EL display device, and an organic EL display device according to a fourth embodiment of the present invention.

FIG. 10 is a sectional view illustrating the color filter of the invention for organic EL display device, which is a filter 40, and an organic-EL-element-side substrate 70. This sectional view, which is a sectional view of structural members of the filter and the substrate, corresponds to the respective cross section positions of the first to third embodiments. FIG. 11 is a sectional view of the organic EL display device, which is a display device 100, formed by joining the color filter 40 for organic EL display device and the organic-EL-element-side substrate 70, which are illustrated in FIG. 10, with each other.

In the individual figures for the present invention, the same reference signs or numbers represent members substantially identical with each other.

A point in which the fourth embodiment illustrated in FIGS. 10 to 11 is different from the first embodiment is that an auxiliary electrode layer 18 functions also as an electroconductive light shielding part formed in a non-pixel area 12. Specifically, the auxiliary electrode layer 18, which is made of an electroconductive material having light shielding performance, is formed in the whole of the non-pixel area 12; and the material of the auxiliary electrode layer 18 covers the entire surfaces of respective sides 17b and tops 17a of convex pillars 17 present in the non-pixel area 12.

It is advisable to use, as a method for forming the auxiliary electrode layer 18, for example, a method of patterning a mask by photolithography, and then filling the material of the auxiliary electrode layer into concaves of the pattern by sputtering or some other method.

The material used in the metal auxiliary electrode layer in the present example is an electroconductive material having light shielding performance, and may be, for example, a metal such as Cu, Ag, Au, Pt, Al, Cr or Co, any alloy thereof, or a multi-layered metal film, a typical example thereof being MAM (molybdenum/aluminum neodymium alloy/molybdenum).

According to the fourth embodiment, the light shielding part 12a and the auxiliary electrode layer 18 can be simultaneously formed, so as to produce an advantage that the process can be made simple, and electrode contact regions thereof with the organic-EL-element-side substrate 70 can be lowered in resistance, and other advantages.

When the present invention has one or more convex pillars, it is desired in a comparison between D1 and D2 to satisfy D1☐D2, preferably D1>D2 characterized in that D1 represents the arrangement density of one(s) arranged in a central region of the transparent substrate, and D2 represents that of one(s) arranged in the other outer circumferential region of the transparent substrate.

Figure 12:
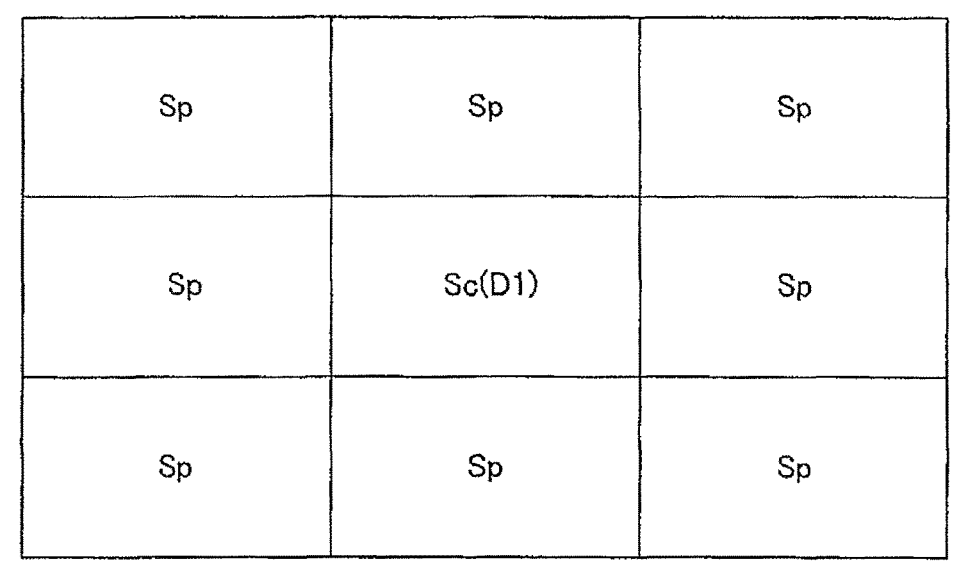

As illustrated in FIG. 12, when D1 and D2 are obtained, the size of the substrate corresponding to the screen is trisected lengthwise and laterally to divide the substrate into nine sections 3×3. A central area Sc thereof corresponds to the central region of the substrate. The arrangement density of convex pillars that is measured in this area is defined as D1. Eight outer areas Sp other than the central region Sc correspond to the outer circumferential region of the substrate. Out of the arrangement densities of convex pillars that are measured in the respective areas, the largest value is defined as D2.

As has been described hereinbefore, the color filter of the present invention comprises a transparent substrate, colored layers that are pixel regions formed on the transparent substrate, and a non-pixel area formed around the colored layers, in which a convex pillar is formed in at least one spot of the non-pixel area, and an auxiliary electrode layer is present on a top and a side of the convex pillar, and on the non-pixel area. Thus, when the color filter is used to constitute an organic EL display device having a large screen, the generation of brightness unevenness can be prevented between the central region of the screen and the outer circumferential region thereof. Furthermore, the organic EL display device has, on the color filter side thereof, the convex pillar with the auxiliary electrode layer; thus, a structure for preventing the generation of the brightness unevenness can be formed with the tendency of decreasing cost risk. Additionally, when the color filter is integrated with an organic-EL-element-side substrate to constitute an organic EL display device, the auxiliary electrode layer formed on the convex pillar can be joined with an electrode of an organic EL element while the organic EL element ensures that this element has a sealing layer having a sufficient protecting function.

Fifth Embodiment

Figure 13:
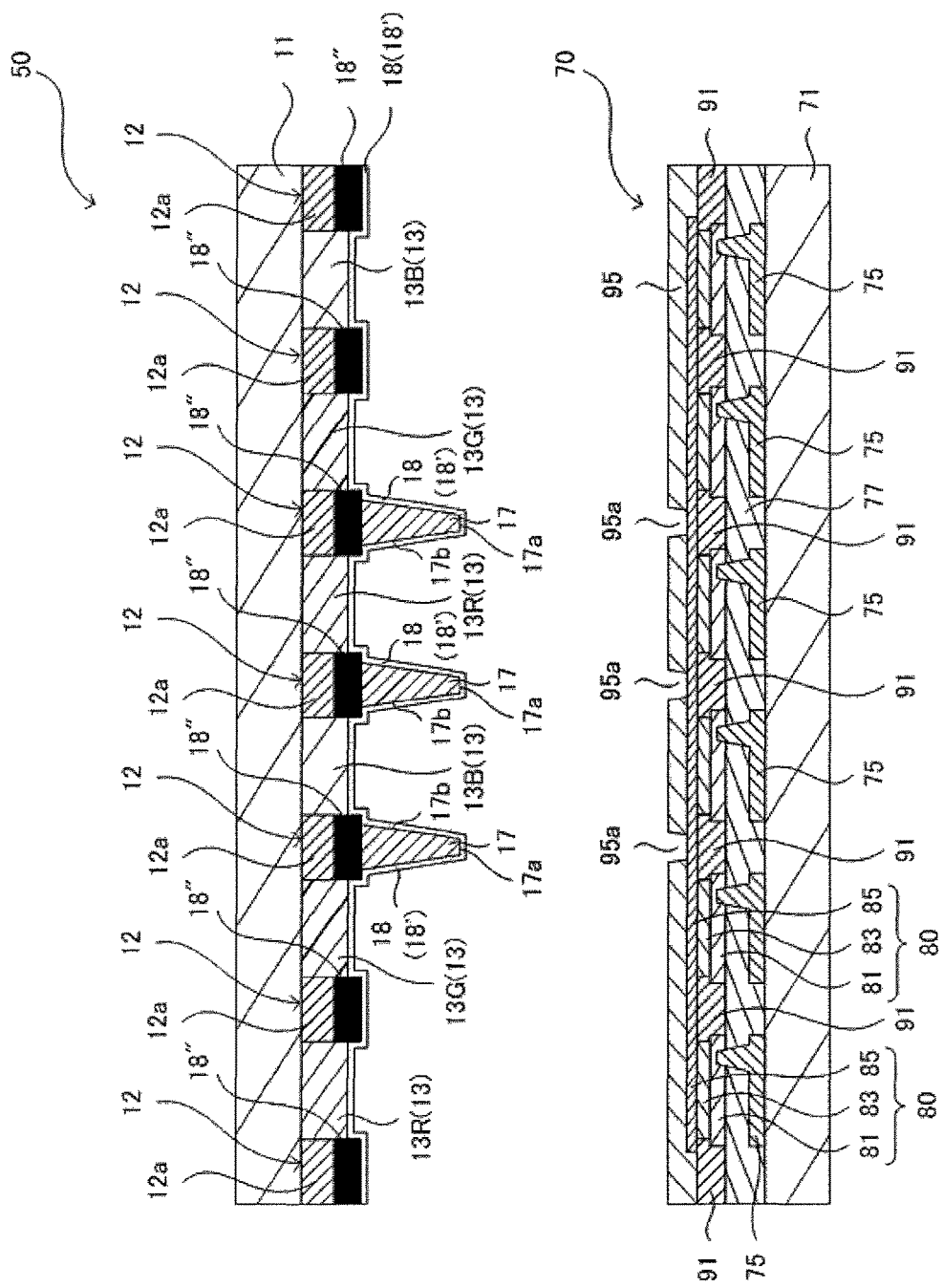
FIG. 13 is a sectional view illustrating a fifth embodiment of the color filter of the present invention for organic EL display device, and an organic-EL-element-side substrate therefor.
Figure 14:
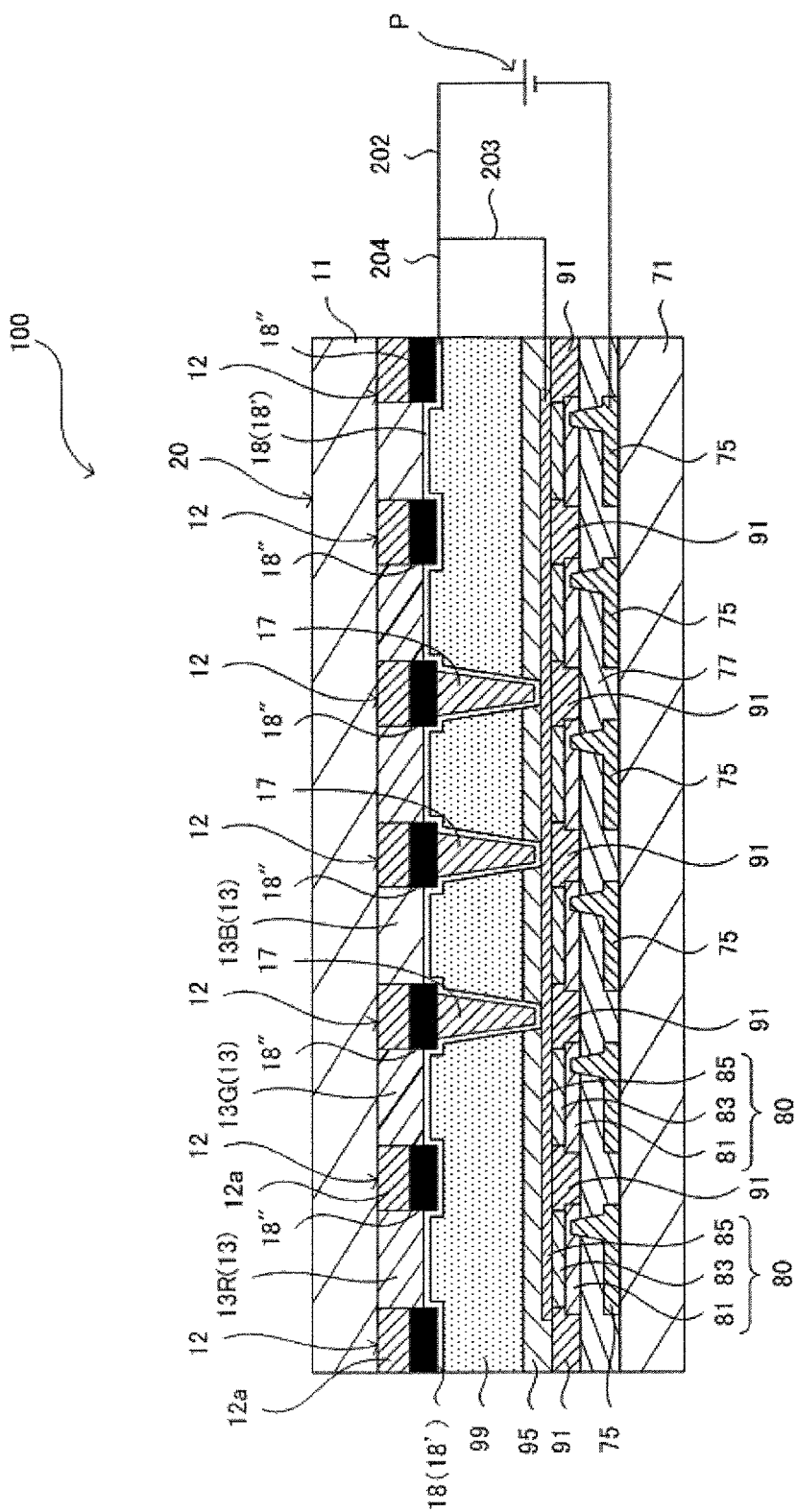
FIG. 14 is a sectional view of an organic EL display device formed by joining the color filter for organic EL display device and the organic-EL-element-side substrate which are illustrated in FIG. 13, with each other.

Referring to FIGS. 13 to 14, a description will be made about a color filter for organic EL display device, and an organic EL display device according to a fifth embodiment of the present invention.

FIG. 13 is a sectional view illustrating the color filter of the invention for organic EL display device, which is a filter 50, and an organic-EL-element-side substrate 70. This sectional view, which is a sectional view of structural members of the filter and the substrate, corresponds to the respective cross section positions of the first to fourth embodiments. FIG. 14 is a sectional view of the organic EL display device, which is a display 100, formed by joining the color filter 50 for organic EL display device and the organic-EL-element-side substrate 70, which are illustrated in FIG. 13, with each other.

Incidentally, in the individual figures for the present invention, the same reference signs or numbers represent members substantially identical with each other.

A point in which the fifth embodiment illustrated in FIGS. 13 to 14 is different from the second embodiment is that a transparent electrode layer 18' is formed to cover the whole of a surface of a metal auxiliary electrode layer 18".

The fifth embodiment illustrated in FIGS. 13 to 14 is an example demonstrating a case where a light shielding part 12a is formed in a non-pixel area 12, and the metal auxiliary electrode layer 18" is formed on the light shielding part 12a.

Incidentally, the light shielding part 12a in the fifth embodiment is not an essential constituent, but in the embodiment, it is preferred that the light shielding part 12a is formed.

The fifth embodiment, that is, the formation of the transparent electrode layer 18' for covering the whole of the surface of the metal auxiliary electrode layer 18" makes it possible to prevent the metal auxiliary electrode layer 18" from being deteriorated by oxidization to prevent a rise in the resistance value of the metal auxiliary electrode layer 18".

As seen in the organic EL display device illustrated in FIG. 14, the whole of the surface of the metal auxiliary electrode layer 18" is covered with the transparent electrode layer 18' when an adhesive layer 99 is filled into a gap between the color filter 50 for organic EL display and the organic-EL-element-side substrate 70 to integrate/join them with each other. By this configuration, contact can be prevented between the metal auxiliary electrode layer 18" and the adhesive layer 99. This makes it possible to prevent a phenomenon that by a hardening shrinkage of the adhesive layer 99 that is caused when the adhesive layer 99 is hardened, the adhesive layer 99 pulls the metal auxiliary electrode layer 18" so that the metal auxiliary electrode layer 18" is peeled off from the light shielding part 12a and any other underlying layer. In short, the adhesiveness of the metal auxiliary electrode layer 18" onto the underlying layer can be maintained.

The present embodiment is not particularly limited as far as the embodiment is an embodiment in which the transparent electrode layer 18' is formed to cover the whole of the surface of the metal auxiliary electrode layer 18". Usually, the transparent electrode layer 18' is formed to cover the surface of a colored layer 13 also. As illustrated in FIGS. 13 to 14, it is particularly preferred that the transparent electrode layer 18' is formed on the whole of the surface (concerned).

Sixth Embodiment

Figure 15:
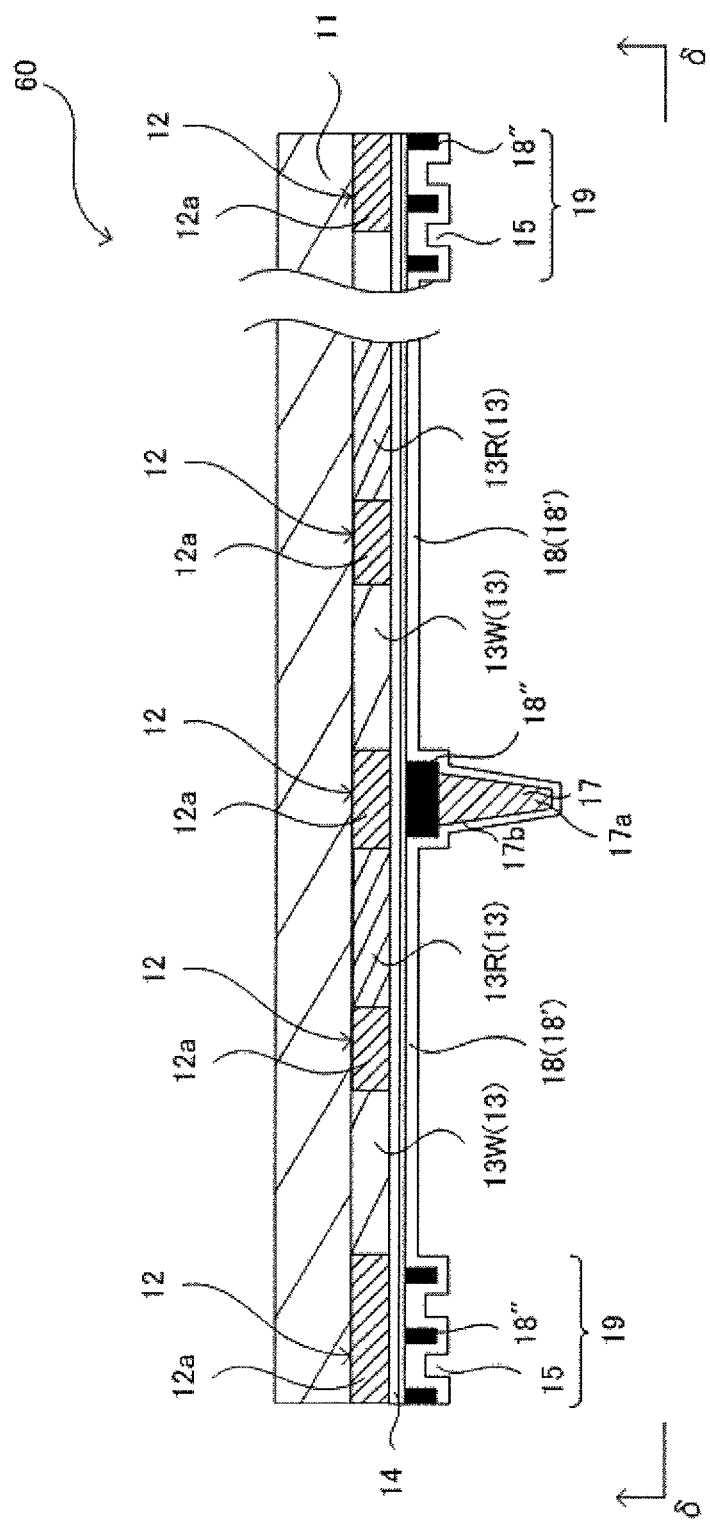
FIG. 15 is a sectional view that partially illustrates a color filter for organic EL display device that is a sixth embodiment, and is a sectional view illustrating a cut surface of the color filter illustrated in FIG. 16A for organic EL display device along line O-P in this plan view.

Referring to FIGS. 15 to 16, a description will be made about a color filter for organic EL display device, and an organic EL display device according to a sixth embodiment of the present invention.

FIG. 15 is a sectional view illustrating the color filter of the invention for organic EL display device, which is a filter 60. This sectional view, which is a sectional view of structural members thereof, is a sectional view obtained by viewing a cut surface of the color filter 60 illustrated in FIG. 16A for organic EL display device along line O-P in this plan view. FIG. 16A is a plan view that partially demonstrates the color filter 60 for organic EL display device, which is the sixth embodiment, and corresponds to a plan view obtained by viewing the color filter along arrows δ-δ in FIG. 15. FIG. 16B is a schematic view demonstrating any one out of openings.

In the individual figures for the present invention, the same reference signs or numbers represent members substantially identical with each other.

A point in which the sixth embodiment illustrated in FIGS. 15 to 16 is different from the fifth embodiment is that: a light shielding part 12a is formed in an outside-display-region light shielding region 19 formed around a display region; a metal auxiliary electrode layer 18" is formed on the light shielding part 12a; a transparent electrode layer 18' is formed to cover the metal auxiliary electrode layer 18" formed in the outside-display-region light shielding region 19; and further the metal auxiliary electrode layer 18" formed in the outside-display-region light shielding region 19 has plural openings 15.

An advantageous effect described below is obtained by the sixth embodiment, in which the light shielding part 12a, the metal auxiliary electrode layer 18" and the transparent electrode layer 18' are formed in the outside-display-region light shielding region 19, and further the metal auxiliary electrode layer 18" has the plural openings 15.

In the prior art, a problem remains that the metal auxiliary electrode layer 18" is relatively low in adhesiveness onto a resin. Thus, when the metal auxiliary electrode layer 18" is formed on the light shielding part 12a made of a resin or when the metal auxiliary electrode layer 18" is formed on an overcoat layer 14 as seen in the present embodiment, the metal auxiliary electrode layer 18" may be unfavorably peeled by a low adhesiveness between the metal auxiliary electrode layer 18" and the light shielding part 12a or between the metal auxiliary electrode layer 18" and the overcoat layer 14.

Between the metal auxiliary electrode layer 18" and the transparent electrode layer 18' made of ITO or some other, a large difference is generally generated in shrinkage degree based on curing treatment in a formation process thereof. Thus, a problem remains that the metal auxiliary electrode layer 18" and the transparent electrode layer 18' are easily peeled from each other by conducting the hardening treatment.

By contrast, in the present embodiment illustrated in FIGS. 15 to 16, the metal auxiliary electrode layer 18" formed in the outside-display-region light shielding region 19 has the plural openings 15 and further the transparent electrode layer 18' is formed to cover the metal auxiliary electrode layer 18". Consequently, the metal auxiliary electrode layer 18" contacts the metal auxiliary electrode layer 18' so that a contact area can be decreased between the transparent electrode layer 18', and the underlying layer of the metal auxiliary electrode layer 18", such as the overcoat layer 14 or the light shielding part 12a, which is relatively low in adhesiveness. Moreover, a region corresponding to the area of the openings 15 made in the metal auxiliary electrode layer 18" can be rendered a contact region which is relatively high in adhesiveness and is located between the transparent electrode layer 18', and the underlying layer of the metal auxiliary electrode layer 18" such as the overcoat layer 14 or the light shielding part 12a. In other words, by heightening, through the metal auxiliary electrode layer 18", the adhesiveness between the transparent electrode layer 18' and the underlying layer of the metal auxiliary electrode layer 18", a phenomenon can be prevented that the metal auxiliary electrode layer 18" is peeled from the underlying layer such as the overcoat layer 14 or the light shielding part 12a.

Moreover, the metal auxiliary electrode layer 18" having the plural openings 15 is formed in the outside-display-region light shielding region 19, which is other than the display region, thereby making it possible to use the metal auxiliary electrode layer 18" in the outside-display-region light shielding region 19 as a frame surrounding the display region 19 of the organic EL display device. Furthermore, in the present embodiment, the light shielding part 12a and the metal auxiliary electrode layer 18" are formed in the outside-display-region light shielding region 19, whereby the color tone of the outside-display-region light shielding region 19, where the light shielding part 12a and the metal auxiliary electrode layer 18" overlap with each other, can be made closer to black. This matter makes it possible to make a boundary more vivid between the display region of the color filter for organic EL display device and the frame surrounding the display region, so that the external appearance of the organic EL display device can be improved.

As seen in the present embodiment illustrated in FIG. 16A, it is preferred that the plural openings made in the metal auxiliary electrode layer are evenly made in the metal auxiliary electrode layer. When the openings are not evenly made in the metal auxiliary electrode layer inside the outside-display-region light shielding region, the following may be generated between a region where the made openings is large in number and a region where the made openings is small in number in the metal auxiliary electrode layer inside the outside-display-region light shielding region: uneven adhesiveness between the metal auxiliary electrode layer, and the underlying layer of the metal auxiliary electrode layer, such as the overcoat layer or the light shielding part. It is therefore feared that a high reliability is not obtained and the light shielding function of the outside-display-region light shielding region becomes uneven.

The word "even" denotes that the number of the openings is ±100 or less per $cm^2$ of the area of the metal auxiliary electrode layer.

In the present embodiment, the metal auxiliary electrode layer inside the outside-display-region light shielding region is not particularly limited as far as the layer has plural openings. For example, the ratio of the total area of the openings to the area of the metal auxiliary electrode layer inside the outside-display-region light shielding region ranges preferably from 1 to 40%, more preferably from 3 to 30%, and in particular preferably from 5 to 20%.

The area of each of the openings made in the metal auxiliary electrode layer may be appropriately adjusted in accordance with the method for making the openings, and others. The area ranges preferably from 25 $\mu m^2$ to 1000 $mm^2$, more preferably from 100 $\mu m^2$ to 100 $mm^2$, and in particular preferably from 500 $\mu m^2$ to 50 $mm^2$.

If the area of each of the openings is smaller than the range, it may be difficult to make the openings in the metal auxiliary electrode layer. If the area of each of the openings is large than the range, the following may be generated between the region where the openings are made and the region where no openings are made inside the outside-display-region light shielding region: uneven adhesiveness between the metal auxiliary electrode layer, and the underlying layer of the metal auxiliary electrode layer, such as the overcoat layer or the light shielding part. It is therefore feared that a high reliability is not obtained and the light shielding function of the outside-display-region light shielding region becomes uneven.

The shape of the openings made in the metal auxiliary electrode layer is appropriately selected in accordance with the method for making the openings, and others. Between the individual openings, the respective shapes thereof may be equivalent to or different from each other. Specific examples of the shape of the openings include a rectangle, a wedge shape, and a circle. Of these shapes, a rectangle is preferred.

When the openings are rectangular, the length L and the width W of the openings are as follows. The length L ranges preferably from 5 to 250 μm, more preferably from 8 to 100 μm, in particular preferably from 10 to 80 μm. The width W ranges preferably from 5 to 4000 μm, more preferably from 12.5 to 1000 μm, and in particular preferably from 50 to 625 μm.

When the length and the width of the openings are in the above-mentioned respective ranges, the transparent electrode layer and the underlying layer of the metal auxiliary electrode layer can be brought into sufficient contact with each other through the openings to prevent the metal auxiliary electrode, layer effectively from being peeled off from the underlying layer.

Incidentally, the length and the width of the openings referred to herein correspond to L and W represented in FIG. 17B, respectively.

The method for making the openings is not particularly limited as far as the method is a method capable of making desired openings in the metal auxiliary electrode layer. The method is, for example, photolithography.

The sixth embodiment illustrated in FIGS. 15 to 16 is an example of a case where the overcoat layer 14 is formed to cover the light shielding part 12a and the colored layer 13, and further the metal auxiliary electrode layer 18", the transparent electrode layer 18' and convex pillars 17 are formed on the overcoat layer 14. Incidentally, in the sixth embodiment, the overcoat layer 14 is not an essential constituent. In the embodiment, however, the formation of the overcoat layer 14 is preferred for flattening the respective surfaces of the colored layer 13 and the light shielding part 12a.

The material of the overcoat layer is not particularly limited as far as the material has a predetermined light transmissivity. The material may be a photocurable resin or thermosetting resin.

The material of the overcoat layer may be an ordinary binder resins, monomer components, a photopolymerization initiator, and/or a thermopolymerization initiators.

The thickness of the overcoat layer is at such a level that the layer can gain a predetermined transmissivity. The thickness is not particularly limited as far as the thickness permits the respective surfaces of the colored layer and the light shielding part to be flattened. For example, the thickness ranges preferably from 0.5 to 5.0 μm, more preferably from 0.7 to 3.0 μm, and in particular preferably from 0.9 to 2.0 μm.

The method for forming the overcoat layer is not particularly limited as far as the method is a method capable of forming the overcoat layer to cover surfaces of the colored layer and the light shielding part. Examples thereof include spin coating, casting, dipping, bar coating, blade coating, roll coating, gravure coating, flexographic, and spray coating methods.

Seventh Embodiment

Referring to FIGS. 17A and 17B, a description will be made about a color filter for organic EL display device, and an organic EL display device according to an eighth embodiment of the present invention.

FIG. 17A is a sectional view which partially illustrates the color filter of the invention for organic EL display device, which is a filter 90. This sectional view, which is a sectional view of structural members thereof, is a sectional view obtained by viewing a cut surface of the color filter 90 illustrated in FIG. 17B for organic EL display device along line Q-P in this plan view. FIG. 17B is a plan view that partially demonstrates the color filter 90 for organic EL display device, which is the seventh embodiment, and corresponds to a plan view obtained by viewing this color filter along arrows ∈-∈ in FIG. 17A.

Incidentally, in the individual figures for the present invention, the same reference signs or numbers represent members substantially identical with each other.

A point in which the seventh embodiment illustrated in FIGS. 17A and 17B is different from the fifth embodiment is that: a light shielding part 12a is formed in a non-pixel area 12; an overcoat layer 14 and a metal auxiliary electrode layer 18" are formed on the light shielding part and a colored layer; on the light shielding part 12a and around pixels each constituted by individual-type colored layers, which are colored layers 13, these colored layers 13 being sub-pixels, at least one of these singly-colored layers of the colored layer 13 is laid; and further convex pillars are formed on the metal auxiliary electrode layer 18" portions on the light shielding part 12a region where the colored layer 13 is laid. The embodiment illustrated in FIGS. 17A and 17B has, as the sub-pixels, red colored layer 13R, green colored layer 13G, blue colored layer 13B, and white colored layer 13W. Four colored layers 13 of the RGBW constitute each of the pixels.

The pixels referred to herein each denotes a minimum unit composed of the individual-type colored layers. In other words, in FIG. 17A, four colored layers of RGBW constitute any one of the pixels. Furthermore, the sub-pixels each denotes each of the colored layers. Although FIG. 17A has illustrated a case where each of the pixels is composed of four colored layers of RGBW, colored layers constituting each of the pixels are not limited to the four of RGBW, and may be therefore three of RGB.

In the same manner as in the sixth embodiment, in the seventh embodiment illustrated in FIGS. 17A and 17B, the overcoat layer 14 is formed to cover the light shielding part 12a and the colored layer 13. The metal auxiliary electrode layer 18", a transparent electrode layer 18', and the convex pillars, which are convex pillars 17, are formed on the overcoat layer 14.

The present embodiment is not particularly limited as far as the embodiment is an embodiment in which at least one singly-colored layer of the colored layer 13 is laid between the individual colored layers 13, which are the sub-pixels, and on the light shielding part 12a; in particular preferably, as has been illustrated in FIGS. 17A and 17B, at least one singly-colored layer of the colored layer 13 is laid around each of the pixels, which is composed of the sub-pixels, and on the light shielding part 12a.

The present embodiment is not particularly limited as far as the embodiment is an embodiment in which at least one singly-colored layer of the colored layer 13 is laid between the individual colored layers 13, which are the sub-pixels, and on the light shielding part 12a; in particular preferably, as has been illustrated in FIGS. 17A and 17B, the colored layer 13 laid between the individual colored layers 13, which are the sub-pixels, and on the light shielding part 12a is a layer extended from the colored layer 13 that is present at pixel regions. This case makes it possible to improve the flatness.

Incidentally, for the white colored layer 13W in FIGS. 17A and 17B, a transparent resin is usually used.

According to the seventh embodiment, that is, the formation of at least one singly-colored layer of the colored layer 13 between the individual colored layers 13 and on the light shielding part 12a, the quantity corresponding to the thickness of the colored layer 13 laid on the light shielding part 12a contributes to the height of the convex pillars 17. Thus, the formation of the convex pillars 17 becomes easy.

The present embodiment is not particularly limited as far as the embodiment is an embodiment in which: at least one singly-colored layer of the colored layer 13 is laid on predetermined parts of the light shielding part 12a; the overcoat layer and the metal auxiliary electrode layer 18" are formed on the predetermined part of the light shielding part 12a; and the convex pillars are formed on portions of the metal auxiliary electrode layer 18" on the light shielding part 12a region where the colored layer 13 is laid. Preferably, as has been illustrated in FIGS. 17A and 17B, on the predetermined parts of the light shielding part 12a, the following are laid: a single colored layer of the colored layer 13; and an another colored layer of the colored layer 13, the layers being adjacent to each other across the light shielding part 12a. The case makes it possible to flatten the upper of the light shielding part 12a on which the colored layer is laid, and prevent a breaking or disconnection of the metal auxiliary electrode layer 18" formed on the light shielding part 12a.

The case also makes it possible to ensure stably pedestal bases of the convex pillars 17 formed across the metal auxiliary electrode layer 18". Furthermore, the case makes it possible to prevent a matter that in the formation of the overcoat layer 14, an overcoat-layer-forming coating solution for forming the overcoat layer 14 flows, on the light shielding part 12a, from the region where the colored layer 13 is laid to the region where the colored layer 13 is not laid. Thus, the height of the overcoat layer 14 can be maintained.

Furthermore, as has been illustrated in FIG. 17A, the plural colored layers 13 may be laid on the light shielding part 12a without overlapping with each other, or may be laid on the light shielding part 12a to overlap with each other.

INDUSTRIAL APPLICABILITY

The present invention is broadly usable in electronic industries including flat-panel displays.

Incidentally, the present invention is not limited to the above-mentioned embodiments. The embodiments are examples. Thus, any embodiment that has substantially the same subject matter as the technical conception recited in the claims of the invention, and produces equivalent or similar effects and advantages is included in the technical scope of the invention.

EXAMPLES

Hereinafter, the present invention will be described in more detail by demonstrating working examples thereof, and comparative examples.

Example 1

Preparation of a Transparent Substrate

As a transparent substrate, prepared was a glass substrate having a size of 100 mm², and a thickness of 0.7 mm.

(Preparation of a Light Shielding-Portion-Forming Composition)

Into a polymerizing tank were first charged 63 parts by mass of methyl methacrylate (MMA), 12 parts by mass of acrylic acid (AA), and 6 parts by mass of 2-hydroxyethyl methacrylate (HEMA), and 88 parts by mass of diethylene glycol dimethyl ether (DMDG). These components were stirred to dissolve the solid components thereof. Thereafter, thereto were added 7 parts by mass of 2,2'-azobis(2-methylbutyronitrile) to dissolve the nitrile homogeneously therein.

Thereafter, the system was stirred at 85° C. for 2 hours under nitrogen gas flow, and further the components therein were caused to react at 100° C. for 1 hour.

To the resultant solution were added 7 parts by mass of glycidyl methacrylate (GMA), 0.4 mass by part of triethylamine, and 0.2 part by mass of hydroquinone, and the system was stirred at 100° C. for 5 hours to yield a copolymer resin solution (solid content by percentage: 50%).

Next, materials described below were stirred at room temperature, and mixed with each other to prepare a curable resin composition A having the following composition:

<Composition of the Curable Resin Composition A>

Copolymer resin solution described above (solid content by percentage: 50%): 16 parts by mass Dipentaerythritol pentaacrylate (SR399™ manufactured by a company Sartomer): 24 parts by mass Ortho-cresol novolak type epoxy resin (EPICOAT 180S70™, manufactured by Yuka Shell Epoxy Kabushiki Kaisha (current Japan Epoxy Resins Co., Ltd.)): 4 parts by mass 2-Methyl-1-(4-methylthiophenyl)-2-morpholinopropane-1-one: 4 parts by mass Diethylene glycol dimethyl ether: 52 parts by mass Next, components having respective amounts described below were mixed with each other, and the pigment was sufficiently dispersed in a sand mill to prepare a black pigment dispersed liquid.

<Black Pigment Dispersed Liquid Composition>

Black pigment (#2600, manufactured by Mitsubishi Chemical Corp.): 20 parts by mass Polymeric dispersing agent (Disperbyk 111™, manufactured by BYK Japan K.K.): 16 parts by mass Solvent (diethylene glycol dimethyl ether): 64 parts by mass Thereafter, the above-mentioned components, and another component each having an amount described below were sufficiently mixed with each other to yield a light shielding-portion-forming composition.

(Formation of Light Shielding-Portion-Forming Composition)

Black pigment dispersed liquid described above: 50 parts by mass

Curable resin composition A described above: 20 parts by mass

Diethylene glycol dimethyl ether: 30 parts by mass (Formation of a Light Shielding Part)

Next, the resultant light shielding-portion-forming composition was painted onto a transparent substrate, and the painted composition was patterned by photolithography. The workpiece was then baked to form a light shielding part.

(Formation of a Colored Layer)

Next, prepared were a red-colored-layer-forming composition, a green-colored-layer-forming composition and a blue-colored-layer-forming composition each having a composition described below.

<Red-Colored-Layer-Forming Composition>
 C.I. Pigment Red 254: 10 parts by mass
 Polysulfone acid type polymeric dispersing agent: 8 parts by mass
 Curable resin composition A described above: 15 parts by mass
 3-Methoxybutyl acetate: 67 parts by mass
<Green-Colored-Layer-Forming Composition>
 C.I. Pigment Green 58: 10 parts by mass
 C.I. Pigment Yellow 138: 3 parts by mass
 Polysulfone acid type polymeric dispersing agent: 8 parts by mass
 Curable resin composition A described above: 12 parts by mass
 3-Methoxybutyl acetate: 67 parts by mass
<Blue-Colored-Layer-Forming Composition>
 C.I. Pigment Blue 1: 5 parts by mass
 Polysulfone acid type polymeric dispersing agent: 3 parts by mass
 Curable resin composition A described above: 25 parts by mass
 3-Methoxybutyl acetate: 67 parts by mass Next, the red-colored-layer-forming composition was painted onto the workpiece by spin coating to cover the light shielding part on the glass substrate. The workpiece was patterned by photolithography. The workpiece was then baked to form a red colored layer.

Thereafter, the green-colored-layer-forming composition and the blue-colored-layer-forming composition were used to form a green colored layer and a blue colored layer by operations equivalent to the above. In this way, a colored layer was formed in which the red colored layer, the green colored layer and the blue colored layer were arranged.

(Formation of a Metal Auxiliary Electrode Layer)

Next, a vapor deposition method was used to form an Ag thin film of 0.5 µm thickness on the light shielding part and the colored layer, and then the workpiece was patterned by photolithography to form a metal auxiliary electrode layer in the non-pixel area, where the light shielding part was formed.

(Formation of Convex Pillars)

Thereafter, photolithography was used to form convex pillars by means of an instrument NN780™ (manufactured by JSR Corp.) at predetermined sites of the metal auxiliary electrode layer formed in the non-pixel area. The width of the bases of the resultant convex pillars was 40 µm and that of the tops thereof was 20 µm. The height thereof was 20 µm. The taper angle inclined from the base sides thereof to the respective tops thereof was 70°.

(Formation of a Transparent Electrode Layer)

Next, an ITO film of 100 nm thickness was formed by sputtering to cover the tops and sides of the convex pillars, and the non-pixel area. In this way, a transparent electrode layer was yielded.

(Annealing Treatment)

Thereafter, the workpiece was subjected to annealing treatment at 150° C. for 40 minutes.

Example 2

A color filter for organic EL display device was produced in the same way as in Example 1 except that the annealing treatment was conducted at 170° C.

Example 3

A color filter for organic EL display device was produced in the same way as in Example 1 except that the annealing treatment was conducted at 190° C.

Example 4

A color filter for organic EL display device was produced in the same way as in Example 1 except that the annealing treatment was conducted at 200° C.

Example 5

A color filter for organic EL display device was produced in the same way as in Example 1 except that the annealing treatment was conducted at 230° C.

Comparative Example 1

A color filter for organic EL display device was produced in the same way as in Example 1 except that no annealing treatment was conducted.

Comparative Example 2

A color filter for organic EL display device was produced in the same way as in Example 1 except that the annealing treatment was conducted at 260° C.

(Evaluation)

1) Metal Auxiliary Electrode Layer Adhesiveness

The adhesiveness of the metal auxiliary electrode layer onto the underlying layer thereof (in each of these examples) was tested according to JIS-K5400. When the area of the metal auxiliary electrode layer remained at a proportion of 50% or more after the test, the example was judged as ○. When the area remained at a proportion of 30% or less, the example was judged as □. When the area remained at a proportion of 10% or less after the test, the example was judged as x.

2) Transparent Electrode Layer Adhesiveness

The adhesiveness of the transparent electrode layer onto the underlying layer thereof was evaluated in the same way as used to evaluate the adhesiveness of the metal auxiliary electrode layer.

3) Transparent Electrode Layer Transmittance

The transmittance of the transparent electrode layer was measured by means of an ultraviolet-visible spectrophotometer UV3600™ manufactured by Shimadzu Corp. Incidentally, the transmittance was the average transmittance in the range of 380 to 780 nm.

The results are shown in Table 1.

TABLE 1

|  | Annealing temperature (° C.) | Metal auxiliary electrode layer adhesiveness | Transparent electrode layer adhesiveness | Transparent electrode layer transmittance (%) |
|---|---|---|---|---|
| Comparative Example 1 | — | ○ | x | 81 |
| Example 1 | 150 | ○ | Δ | 84 |
| Example 2 | 170 | ○ | ○ | 87 |
| Example 3 | 190 | ○ | ○ | 94 |
| Example 4 | 200 | ○ | ○ | 94 |
| Example 5 | 230 | Δ | ○ | 94 |
| Comparative Example 2 | 260 | x | ○ | 94 |

As shown in Table 1, in Examples 1 to 5, in which the annealing temperature of their transparent electrode layer was from 150 to 230° C., better results were obtained about each of the adhesiveness of their metal auxiliary electrode layer, the adhesiveness of the transparent electrode layer, and the transmittance of the transparent electrode layer than in Comparative Example 1, in which no annealing treatment was conducted, and Comparative Example 2, in which the temperature of the annealing treatment was 260° C. In particular, in Examples 2 to 4, in which the annealing temperature of the transparent electrode layer was from 170 to 200° C., the results thereof were even better.

REFERENCE SIGNS LIST 10, 20, 30, 40, 50, 60, and 90: color filters for organic electroluminescence display device
11: transparent substrate
12: non-pixel area
13: colored layer
14: overcoat layer
15: openings
17: convex pillars
17a: tops of convex pillars
17b: sides of convex pillars
19: outside-display-region light shielding region
18: auxiliary electrode layer
70: organic-EL-element-side substrate
71: substrate
81: lower-side electrode layer
83: organic EL layer
85: upper-side transparent electrode layer
95: sealing layer
95a: concaves
100: organic electroluminescence display device

The invention claimed is:

1. A color filter for organic electroluminescence display device,
which is used in an organic electroluminescence display device using, as a light emitting source,
light from an organic EL layer of an organic electroluminescence element, wherein the color filter for organic electroluminescence display device comprises a transparent substrate,
a colored layer that is a pixel region formed on the transparent substrate, a non-pixel area formed around the colored layer,
a convex pillar formed in at least one spot of the non-pixel area and an auxiliary electrode layer formed on a top and a side of the convex pillar, and on the non-pixel area,
wherein the auxiliary electrode layer has a metal auxiliary electrode layer and a transparent electrode layer,
the metal auxiliary electrode layer is arranged into a linear pattern in the non-pixel area, the convex pillar is formed on the non-pixel area in which the metal auxiliary electrode layer is linearly arranged, and
the transparent electrode layer is formed to cover the top and the side of the convex pillar, and the non-pixel area, and contact the metal auxiliary electrode layer,
wherein a light shielding part is formed in the non-pixel area on the transparent substrate,
an overcoat layer is formed to cover the light shielding part and the colored layer,
the metal auxiliary electrode layer and the transparent electrode layer are formed on the overcoat layer,
at least one singly-colored layer of the colored layers is laid on an entire surface of the light shielding part in the non-pixel area between the colored layers,
the convex pillar is formed on the metal auxiliary electrode layer which is on the light shielding part where the colored layer is laid, and
the transparent electrode layer formed on the top of the convex pillar is exposed outside so as to contact an upper-side transparent electrode layer in the organic electroluminescence element.

2. The color filter for organic electroluminescence display device according to claim 1, wherein the transparent electrode layer is formed to cover an entire surface of the metal auxiliary electrode layer.

3. The color filter for organic electroluminescence display device according to claim 1, wherein
a light shielding part is formed in an outside-display-region light shielding region formed around its display region,
the metal auxiliary electrode layer is formed on the light shielding part,
the transparent electrode layer is formed to cover the metal auxiliary electrode layer formed in the outside-display-region light shielding region, and
the metal auxiliary electrode layer formed in the outside-display-region light shielding region has plural openings.

4. The color filter for organic electroluminescence display device according to claim 1, wherein the auxiliary electrode layer has a transparent electrode layer, and the transparent electrode layer is formed to cover the top and the side of the convex pillar and the non-pixel area.

5. The color filter for organic electroluminescence display device according to claim 1, wherein the auxiliary electrode layer has a metal auxiliary electrode layer, the metal auxiliary electrode layer is linearly arranged in the non-pixel area, and is further arranged continuously and linearly on the side and the top of the convex pillar formed in the non-pixel area.

6. The color filter for organic electroluminescence display device according to claim 1, wherein the auxiliary electrode layer is formed as an electroconductive light shielding part formed in the non-pixel area.

7. The color filter for organic electroluminescence display device according to claim 1, wherein the non-pixel area has a cross part at which a line in a lengthwise direction crosses a line in a lateral direction, and the convex pillar is present at the cross part.

8. The color filter for organic electroluminescence display device according to claim 1, wherein the convex pillar is formed in a tapered shape having a diameter that decreases gradually from a base side toward the top of the convex pillar.

9. The color filter for organic electroluminescence display device according to claim 1, wherein the color filter for organic electroluminescence display device has one or plural convex pillars, and D1>D2 is satisfied in a comparison between D1 and D2, in which D1 representing an arrangement density of the convex pillar(s) arranged in a central region of the transparent substrate, and D2 representing an arrangement density of the convex pillar(s) arranged in the other outer circumferential region of the transparent substrate.

10. An organic electroluminescence display device, comprising the colored filter for organic electroluminescence display device recited in claim 1, and
an organic-EL-element-side substrate having a substrate, and an organic electroluminescence element containing an organic EL layer formed on the substrate, wherein:
the color filter for organic electroluminescence display device and the organic-EL-element-side substrate are arranged to oppose the colored layer and the organic electroluminescence element to each other;
the organic electroluminescence element comprises the organic EL layer, a lower-side electrode layer and an upper-side transparent electrode layer that are paired and arranged to sandwich the organic EL layer therebetween, and a sealing layer formed on the upper-side transparent electrode layer to cover the organic electroluminescence element; and
the sealing layer has a concave into which a tip portion of the convex pillar formed in the color filter for organic electroluminescence display device can be fitted so that a portion of the auxiliary electrode layer that is formed on the top of the convex pillar contacts the upper-side transparent electrode layer to attain electrical conduction therebetween.

11. The organic electroluminescence display device according to claim 10, wherein a part of the sealing layer where the concave is made is a gap portion between adjacent organic EL layers.

12. The organic electroluminescence display device according to claim 10, wherein a depth of the concave is such a depth that the concave reaches to the upper-side transparent electrode layer.

13. The organic electroluminescence display device according to claim 10, wherein an electroconductive film is formed on a side of the concave.

14. The organic electroluminescence display device according to claim 10, wherein a TFT for controlling an electric current flowing the organic electroluminescence element is formed for each organic electroluminescence element on the substrate of the organic-EL-element-side substrate.

15. The organic electroluminescence display device according to claim 10, wherein a light emitting layer included in the organic EL layer is a white light emitting layer.

* * * * *